(12) United States Patent
Jeong et al.

(10) Patent No.: US 12,286,503 B2
(45) Date of Patent: Apr. 29, 2025

(54) BRUSH POLYMER TERMINATED WITH PHOSPHONATE FOR DSA

(71) Applicant: Merck Patent GmbH, Darmstadt (DE)

(72) Inventors: EunJeong Jeong, Gyeonggi-do (KR); Durairaj Baskaran, Bridgewater, NJ (US); Jihoon Kim, North Wales, PA (US)

(73) Assignee: Merck Patent GmbH, Darmstadt (DE)

( * ) Notice: Subject to any disclaimer, the term of this patent is extended or adjusted under 35 U.S.C. 154(b) by 69 days.

(21) Appl. No.: 18/246,869

(22) PCT Filed: Oct. 18, 2021

(86) PCT No.: PCT/EP2021/078756
§ 371 (c)(1),
(2) Date: Mar. 28, 2023

(87) PCT Pub. No.: WO2022/084221
PCT Pub. Date: Apr. 28, 2022

(65) Prior Publication Data
US 2024/0010865 A1    Jan. 11, 2024

Related U.S. Application Data

(60) Provisional application No. 63/238,872, filed on Aug. 31, 2021, provisional application No. 63/218,957, (Continued)

(51) Int. Cl.
*C08F 8/40* (2006.01)
*C07F 9/40* (2006.01)
(Continued)

(52) U.S. Cl.
CPC .......... *C08F 4/6497* (2013.01); *C07F 9/4021* (2013.01); *C08F 112/08* (2013.01); *C08F 120/14* (2013.01); *C09D 125/06* (2013.01); *C07F 9/3229* (2013.01); *C08F 4/6297* (2013.01); *C08F 8/40* (2013.01); *C08F 30/02* (2013.01); *C08F 130/02* (2013.01); *C08F 230/02* (2013.01); *C08F 2810/40* (2013.01); *C08J 2343/02* (2013.01); *C08J 2443/02* (2013.01); *C08L 43/02* (2013.01); *C09D 133/12* (2013.01); *C09D 143/02* (2013.01); *C09J 143/02* (2013.01); *C09J 185/02* (2013.01)

(58) Field of Classification Search
CPC ........ C08F 8/40; C08F 4/6297; C08F 4/6497; C08F 30/02; C08F 130/02; C08F 230/02; C08J 2343/02; C08J 2443/02; C08L 43/02; C09D 143/02; C09J 143/02; C09J 185/02
See application file for complete search history.

(56) References Cited

U.S. PATENT DOCUMENTS

2013/0330668 A1*  12/2013  Wu .......................... C08F 4/04
                                                              526/216
2016/0122580 A1   5/2016   Hong

FOREIGN PATENT DOCUMENTS

CN          110540552 A     12/2019
WO       2008039959 A2      4/2008
(Continued)

OTHER PUBLICATIONS

Peng et al. "Pd(0)/iodide salt-mediated Heck reaction of aryl nonaflates: Application to the synthesis of 2-(1-alkenyl) phenylphosphonates". Journal of Fluorine Chemistry. 132 (2011) p. 982-986 (Year: 2011).*

(Continued)

*Primary Examiner* — Ling Siu Choi
*Assistant Examiner* — David L Miller
(74) *Attorney, Agent, or Firm* — EMD Performance Materials Corp.

(57) ABSTRACT

The disclosed subject matter relates compounds of structure (I), and polymers of structure (II) having a polydispersity ranging from 1 to about 1.1, compositions comprising said polymers and a spin casting solvent, the process of forming a pinning layer selectively on metal with said composition and the process of using said pinning layers to affect chemoepitaxy directed self-assembly of an overlying block copolymer, and the subsequent process of pattern transfer of this self-assembled layer into a substrate by etching.

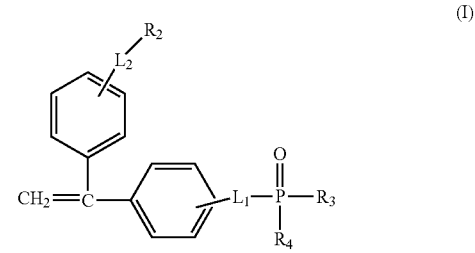

(I)

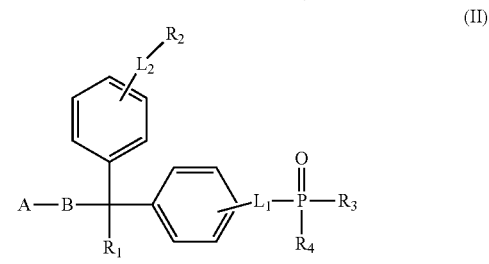

(II)

24 Claims, No Drawings

Related U.S. Application Data filed on Jul. 7, 2021, provisional application No. 63/093,894, filed on Oct. 20, 2020.

(51) Int. Cl.

| | |
|---|---|
| *C08F 4/649* | (2006.01) |
| *C08F 112/08* | (2006.01) |
| *C08F 120/14* | (2006.01) |
| *C09D 125/06* | (2006.01) |
| C07F 9/32 | (2006.01) |
| C08F 4/629 | (2006.01) |
| C08F 30/02 | (2006.01) |
| C08F 130/02 | (2006.01) |
| C08F 230/02 | (2006.01) |
| C08L 43/02 | (2006.01) |
| C09D 133/12 | (2006.01) |
| C09D 143/02 | (2006.01) |
| C09J 143/02 | (2006.01) |
| C09J 185/02 | (2006.01) |

(56) References Cited

FOREIGN PATENT DOCUMENTS

| | | |
|---|---|---|
| WO | 2020148305 A1 | 7/2020 |
| WO | 2022084221 A1 | 4/2022 |

OTHER PUBLICATIONS

Ai-Yun Peng et al; Journal of Fluorine Chemistry, Elsevier, NL, vol. 132. No. 11, Jun. 22, 2011, pp. 982-986.

Zhang Ji-Shu et al; European Journal of Organic Chemistry, vol. 2020, No. 9, Mar. 8, 2020, pp. 1148-1153.

Ghislain David et al; Phosphorus, Sulfur, and Silicon and the Related Elements; Taylor & Francis Group, 179, 12, 2627-2634.

PCT Search Report and Written Opinion, PCT/EP2021/078756, International Filing date Oct. 18, 2021.

* cited by examiner

BRUSH POLYMER TERMINATED WITH PHOSPHONATE FOR DSA

This application is a national stage application, filed under 35 U.S.C. § 371, of International Patent Application No. PCT/EP2021/078756 (filed on 18 Oct. 2021) which claims the benefit of U.S. Provisional Patent Application No. 63/093,894 (filed on 20 Oct. 2020) U.S. Provisional Patent Application No. 63/218,957 each (filed on 7 Jul. 2021) U.S. Provisional Patent Application No. 63/238,872 (filed on 31 Aug. 2021) each of which applications is incorporated herein by reference in their entirety.

BACKGROUND

Field

The disclosed subject matter pertains to novel acrylate compounds with pendant phosphonate moieties, which can form acrylate or styrene comprising polymers having these phosphonates as graftable end groups, and compositions with a spin casting solvent which can selectively form polar or non-polar brush layers on metal substrates. The invention also relates to the process of forming polar or non-polar brushes on a substrate using these compositions and using these brushes for directed self-assembly.

Related Art

In conventional lithography approaches, ultraviolet (UV) radiation may be used to expose through a mask onto a photoresist layer coated on a substrate or layered substrate. Positive or negative photoresists are useful, and these can also contain a refractory element such as silicon to enable dry development with conventional integrated circuit (IC) plasma processing. In a positive photoresist, UV radiation transmitted through a mask causes a photochemical reaction in the photoresist such that the exposed regions are removed with a developer solution or by conventional IC plasma processing. Conversely, in negative photoresists, UV radiation transmitted through a mask causes the regions exposed to radiation to become less removable with a developer solution or by conventional IC plasma processing. An integrated circuit feature, such as a gate, via or interconnect, is then etched into the substrate or layered substrate, and the remaining photoresist is removed. When using conventional lithographic exposure processes, the dimensions of features of the integrated circuit feature are limited. Further reduction in pattern dimensions are difficult to achieve with radiation exposure due to limitations related to aberrations, focus, proximity effects, minimum achievable exposure wavelengths and maximum achievable numerical apertures. Directed self-assembly is a promising approach which has been of interest in overcoming some of the drawback of conventional lithography as outlined above.

Specifically, directed self-assembly of block copolymers is a method useful for generating very small patterned features for the manufacture of microelectronic devices in which the critical dimensions (CD) of features, usually on the order of nano scale ranging in feature size from 10 nm to 50 nm, can be achieved. Achieving feature sizes below 10 nm using conventional approaches for directed self-assembly of block copolymers is challenging. Directed self-assembly methods such as those based on graphoepitaxy and chemical epitaxy of block copolymers are desirable for extending the resolution capabilities of lithographic technology.

These techniques can be employed to either enhance conventional lithographic techniques by enabling the generation of pattern with higher resolution and/or improving CD control for EUV, e-beam, deep UV or immersion lithography. The directed self-assembly block copolymer comprises a block of etch resistant polymeric unit and a block of highly etchable polymeric unit, which when coated, aligned and etched on a substrate give regions of high-resolution patterns.

Known examples of block copolymers suitable for directed self-assembly are ones capable of microphase separation and comprising a block rich in carbon (such as styrene or containing some other element like Si, Ge, and Ti) which is resistant to plasma etch, and a block which is highly plasma etchable or removable, which can provide a high resolution pattern definition. Examples of highly etchable blocks can comprise monomers which are rich in oxygen and which do not contain refractory elements and are capable of forming blocks which are highly etchable, such as methyl methacrylate. The plasma etching gases used in the etching process of defining the self-assembly pattern typically are those used in processes to make integrated circuits (IC). In this manner very fine patterns can be created on typical IC substrates compared to conventional lithographic techniques, thus achieving pattern multiplication.

In the graphoepitaxy directed self-assembly method, the block copolymer self-organizes on a substrate that is pre-patterned with conventional lithography (Ultraviolet, Deep UV, and e-beam, Extreme UV (EUV) exposure source) to form topographical features such as a line/space (L/S) or contact hole (CH) pattern. In an example of L/S directed self-assembly array, the block copolymer can form self-aligned lamellar regions with a sub-lithographic pitch in the trenches between sidewalls of pre-pattern, thus enhancing pattern resolution by subdividing the space in the trench between the topographical lines into finer patterns. Similarly, features such as contact holes can be made denser by using graphoepitaxy in which a suitable block copolymer arranges itself by directed self-assembly within an array of pre-patterned holes or pre-patterned posts defined by conventional lithography, thus forming a denser array of regions of etchable and etch resistant domains which when etched give rise to a denser array of contact holes. In addition, block copolymers can form a single and smaller etchable domain at the center of prepattern hole with proper dimension and provide potential shrink and rectification of the hole in prepattern. Consequently, graphoepitaxy has the potential to offer both pattern rectification and pattern multiplication.

In chemical epitaxy DSA methods, the self-assembly of the block copolymer occurs on a surface that has regions of differing chemical affinity but no or very slight topography to guide the self-assembly process. For example, the chemical prepattern could be fabricated using lithography (UV, Deep UV, e-beam, EUV) and nanofabrication process to create surfaces of different chemical affinity in a line and space (L/S) pattern. These areas may present little to no topographical difference but do present a surface chemical pattern to direct self-assembly of block copolymer domains. This technique allows precise placement of these block copolymer domains of higher spatial frequency than the spatial frequency of the prepattern. The aligned block copolymer domains can be subsequently pattern transferred into an underlying substrate after plasma or wet etch processing. In addition, Chemical epitaxy has the advantage that the block copolymer self-assembly can rectify variations in the surface chemistry, dimensions, and roughness of the underlying chemical pattern to yield improved line-edge roughness and CD control in the final self-assembled block copolymer domain pattern. Other types of patterns such as contact holes (CH) arrays could also be generated or rectified using chemoepitaxy.

The ability of a BCP to phase separate depends on the Flory Huggins interaction parameter ($\chi$). PS-b-PMMA (poly(styrene-block-methyl methacrylate) is the most promising candidate for directed self-assembly (DSA) applications. However, the minimum half-pitch of PS-b-PMMA is limited to about 10 nm because of lower interaction parameter ($\chi$) between PS and PMMA. To enable further feature miniaturization, a block copolymer with a larger interaction parameter between two blocks (higher chi) is highly desirable.

For lithography applications, orientation of the block copolymer domains perpendicular to the substrate is desirable. For a conventional block copolymer such as PS-b-PMMA in which both blocks have similar surface energies at the BCP-air interface, this can be achieved by coating and thermally annealing the block copolymer on a layer of non-preferential or neutral material that is grafted or cross-linked at the polymer-substrate interface. Due to larger difference in the interaction parameter between the domains of higher-Chi block copolymers, it is important to control both BCP-air and BCP-substrate interactions. Many orientation control strategies for generating perpendicularly oriented BCP domains have been implemented with higher-Chi BCPs. For example, solvent vapor annealing has been used for orientation control of polystyrene-b-polyethylene oxide (PS-b-PEO), polystyrene-b-polydimethylsiloxane (PS-b-PDMS), polystyrene-b-poly(2-vinyl pyridine) (PS-b-P2VP), polylactide-b-poly(trimethylsilylstyrene) PLA-b-PTMSS and PDMS-b-PHOST. Introducing a solvent vapor chamber and kinetics of solvent vapor annealing may complicate DSA processing. Alternatively, the combination of neutral underlayers and topcoat materials has been applied to PS-b-P2VP, PS-b-PTMSS and PLA-b-PTMSS to achieve perpendicular orientation of the polymer domains. However, the additional topcoat materials may increase the process cost and complexity. Thus, there exists a need to have a topcoat free higher-Chi BCP system using simple thermal annealing on a range of preferential and non-preferential substrates.

Grafted polymer which form covalently bound film on the surface of a substrate can be prepared by plasma deposition, electrochemical deposition or self-assembly. The strength of covalent bond predicates the adherence of film; however, these films are generally much more adherent than films which only interact through secondary forces with the surface of the substrate such as those prepared by spin casting. Consequently, because of this higher adherence formation of a grafted polymer film on a substrate material is useful for a variety of applications. Among these are:

One example are biomaterials where substrates are made bio compatible by grafting a polymer at the surface of a material, such as medical prostheses, without compromising bulk mechanical properties.

The grating of polymers on substrate surfaces also has been employed to impart anti-bio fouling of these surfaces or to improve their corrosion resistance.

Coating solutions, where the grafting of a polymer on a substrate surface can change the surface properties of these substrates to affect better coating; also in suspension of metal or metal oxide nanoparticles the coating ability and stability of these suspensions may be improved by the grafting of polymers at the surface of these nanoparticles.

Self-assembly and directed self-assembly, where the grating of polymer brushes on the surface of Silicon or Silicon oxide substrates can be employed for the formation of neutral layer on these surfaces which allow block copolymer to orient their domains perpendicular to the substrate surface during self-assembly or directed self-assembly.

Directed self-assembly of block copolymers is a method useful for generating smaller and smaller patterned features for the manufacture of microelectronic devices in which the critical dimensions (CD) of features on the order of nanoscale can be achieved. Directed self-assembly methods are desirable for extending the resolution capabilities of microlithographic technology. In a conventional lithography approach, ultraviolet (UV) radiation may be used to expose through a mask onto a photoresist layer coated on a substrate or layered substrate. Positive or negative photoresists are useful, and these can also contain a refractory element such as silicon to enable dry development with conventional integrated circuit (IC) plasma processing. In a positive photoresist, UV radiation transmitted through a mask causes a photochemical reaction in the photoresist such that the exposed regions are removed with a developer solution or by conventional IC plasma processing. Conversely, in negative photoresists, UV radiation transmitted through a mask causes the regions exposed to radiation to become less removable with a developer solution or by conventional IC plasma processing. An integrated circuit feature, such as a gate, via or interconnect, is then etched into the substrate or layered substrate, and the remaining photoresist is removed. When using conventional lithographic exposure processes, the dimensions of features of the integrated circuit feature are limited. Further reduction in pattern dimensions are difficult to achieve with radiation exposure due to limitations related to aberrations, focus, proximity effects, minimum achievable exposure wavelengths and maximum achievable numerical apertures. The need for large-scale integration has led to a continued shrinking of the circuit dimensions and features in the devices. In the past, the final resolution of the features has been dependent upon the wavelength of light used to expose the photoresist, which has its own limitations. Direct assembly techniques, such as graphoepitaxy and chemoepitaxy using block copolymer imaging, are highly desirable techniques used to enhance resolution while reducing CD variation. These techniques can be employed to either enhance conventional UV lithographic techniques or to enable even higher resolution and CD control in approaches employing EUV, e-beam, deep UV or immersion lithography. The directed self-assembly block copolymer comprises a block of etch resistant copolymeric unit and a block of highly etchable copolymeric unit, which when coated, aligned and etched on a substrate give regions of very high-density patterns.

Neutral layers are layers on a substrate or the surface of a treated substrate which have no affinity for either of the block segment of a block copolymer employed in directed self-assembly. In the graphoepitaxy method of directed self-assembly of block copolymer, neutral layers are useful as they allow the proper placement or orientation of block polymer segments for directed self-assembly which leads to proper placement of etch resistant block polymer segments and highly etchable block polymer segments relative to the substrate. For instance, in surfaces containing line and space features which have been defined by conventional radiation lithography, a neutral layer allows block segments to be oriented so that the block segments are oriented perpendicular to the surface of the substrates, an orientation which is ideal for both pattern rectification and pattern multiplication depending on the length of the block segments in the block copolymer as related to the length between the lines defined by conventional lithography. If a substrate interacts too strongly with one of the block segments it would cause it to lie flat on that surface to maximize the surface of contact between the segment and the substrate; such a surface would perturb the desirable perpendicular alignment which can be used to either achieve pattern rectification or pattern multiplication based on features created through conventional lithography. Modification of selected small areas or pinning of substrate to make them strongly interactive with one block of the block copolymer and leaving the remainder of the surface coated with the neutral layer can be useful for forcing the alignment of the domains of the block copolymer in a desired direction, and this is the basis for the pinned chemoepitaxy or graphoepitaxy employed for pattern multiplication.

There is a need for a novel materials which can form a grafted polymer layer on semiconductor (e.g. Si, GaAs, and the like), metal (Cu, W, Mo, Al, Zr, Ti, Hf, Au and the like) and metal oxide (Copper oxide, Aluminum oxide, Hafnium oxide, Zirconium oxide, Titanium oxide and the like) substrates through a simple spin coating, followed by a post coat bake to affect chemical bonding without the presence of activating components to promote the grafting reaction on the substrate such as acidic compounds, thermal acid generators, photoacid generator, thermal radical generators, photochemical radical generators, basic additives, thermal base generators or photobase generators. The presence of such thermally or photochemically reactive additives compounds is undesirable because the small size and reactivity of these compounds, they may lead them to diffuse out of the grafted film into other layers causing undesirable reaction such as corrosion. Another need is for a grafting material in which graftable polymer does not contain overly reactive grafting sites which may deleteriously affect shelf life of solutions of a grafting solution in an organic solvent such as a spin casting solvent. There is also a need for novel grafting material than can be made to have selective grafting towards specific types of substrates by altering grafting bake. In this manner one can alter the surface properties of these materials, such as coat-ability, and corrosion resistance by a simple spin coating process without having to use plasma deposition or electrochemical grating, and also in the case of a novel selective grafting process using the novel materials of this invention, in one step coat only one type of material on a substrate which contains a topographical or chemical pattern in which different materials are present on one substrate. There is also a need for novel neutral layer compositions which when formed into a layer remain neutral to the self-assembly block copolymer and yet are not damaged by processing steps of directed self-assembly techniques, and can further enhance the lithographic performance of the directed self-assembly materials and processes, especially reducing the number of processing steps and providing better pattern resolution with good lithographic performance. There is also a need for coat-able pinning materials for small areas of metal or metal oxide substrates otherwise coated with a neutral layer, for instance in the chemoepitaxy approach, in order to force the domains oriented perpendicularly with the neutral layer substrate to force the alignment of the domains in a desired direction. There is also a need for a polar and non-polar brush compositions that will selectively only form on one type of material on a substrate containing a pattern with different materials to create a pinning area.

The present invention relates to novel compounds containing a pendant phosphonate moiety which can be reacted with acrylate monomers or styrenic monomers to respectively form acrylate polymers or styrenic polymers with a phosphonate end groups which when formulated with a spin casting solvent respectively form selectively either a polar or non-polar pinning layer brush layer on metal substrates while not grafting on non-metal substrates. a polar or non-polar pinning layer brush layer useful for directed self-assembly in specific device structure of employed in DSA, where each block of di-block copolymers or triblock copolymers must settle down on substrates which contain both metal and dielectric areas (e.g. Si, $SiO_x$). To solve this problem these different areas need to be coated with two different components which resembles two blocks in di-block copolymer, respectively. Here, the compositions containing these polar and non-polar terminal phosphonate moieties interacts with the metal areas but not with the dielectric areas.

SUMMARY

One aspect of the disclosed subject matter pertains to compounds of structure (I), wherein
$R_2$ is H, a halide, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)($R_3$)($R_4$), wherein $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; $L_1$ and $L_2$ are independently a direct valence bond, or a C-1 to C-8 alkylene spacer group.

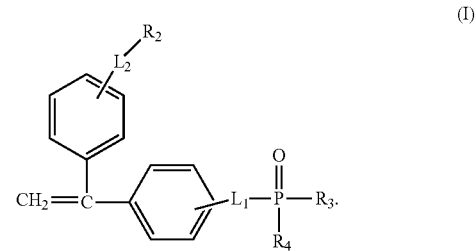

(I)

Another aspect of this invention pertains polymers of structure (II), having a polydispersity ranging from 1 to about 1.1, wherein
$R_1$ is H, a C-1 to C-8 linear alkyl, a C-3 to C-8 branched alkyl, a C-3 to C-8 cyclic alkyl, an aryl, or an alkylenearyl (i.e. -alkylene-aryl);
$R_2$ is H, a halide, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)($R_3$)($R_4$), wherein $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy;
$L_1$ and $L_2$ are independently a direct valence bond, or a C-1 to C-8 alkylene spacer group;
B is a direct valence bond, or a methylene spacer (—$CH_2$—)
A is a styrenic polymer chain, or an acrylic polymer chain.

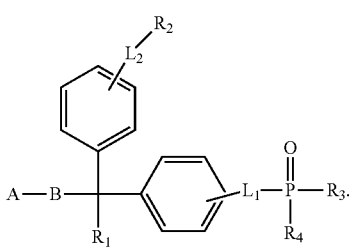
(II)

Other aspects of this invention are compositions comprised of a polymer of structure (II) and a spin casting solvent.

Other aspects of this invention include the process of forming a pinning layer using said composition and the chemoepitaxy process of using said pinning in directed self-assembly of an overlying block copolymer and the subsequent process of etching the directed self-assembled block polymer layer into as substrate.

DETAILED DESCRIPTION

It is to be understood that both the foregoing general description and the following detailed description are illustrative and explanatory and are not restrictive of the subject matter as claimed. In this application, the use of the singular includes the plural, the word "a" or "an" means "at least one," and the use of "or" means "and/or," unless specifically stated otherwise. Furthermore, the use of the term "including," as well as other forms such as "includes" and "included," is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature references and similar materials defines a term in a manner that contradicts the definition of that term in this application, this application controls.

Unless otherwise indicated, "alkyl" refers to hydrocarbon groups which can be linear, branched (e.g., methyl, ethyl, propyl, isopropyl, tert-butyl and the like) or cyclic (e.g., cyclohexyl, cyclopropyl, cyclopentyl and the like) multicyclic (e.g., norbornyl, adamantyl and the like). These alkyl moieties may be substituted or unsubstituted as described below. The term "alkyl" refers to such moieties with C-1 to C-8 carbons. It is understood that for structural reasons linear alkyls start with C-1, while branched alkyls and cyclic alkyls start with C-3 and multicyclic alkyls start with C-5. Moreover, it is further understood that moieties derived from alkyls described below, such as alkyloxy, have the same carbon number ranges unless otherwise indicated. If the length of the alkyl group is specified as other than described above, the above described definition of alkyl still stands with respect to it encompassing all types of alkyl moieties as described above and that the structural consideration with regards to minimum number of carbons for a given type of alkyl group still apply.

Alkyloxy (a.k.a. Alkoxy) refers to an alkyl group on which is attached through an oxy (—O—) moiety (e.g. methoxy, ethoxy, propoxy, butoxy, 1,2-isopropoxy, cyclopentyloxy cyclohexyloxy and the like). These alkyloxy moieties may be substituted or unsubstituted as described below.

Halo or halide refers to a halogen, F, Cl, Br or I which is linked by one bond to an organic moiety.

Haloalkyl refers to a linear, cyclic or branched saturated alkyl group such as defined above in which at least one of the hydrogens has been replaced by a halide selected from the group of F, Cl, Br, I or mixture of these if more than one halo moiety is present. Fluoroalkyls are a specific subgroup of these moieties.

The term "alkylene" refers to hydrocarbon groups which can be a linear, branched or cyclic which has two or more attachment points (e.g., of two attachment points: methylene, ethylene, 1,2-isopropylene, a 1,4-cyclohexylene and the like; of three attachment points 1,1,1-substituted methane, 1,1,2-substituted ethane, 1,2,4-substituted cyclohexane and the like). Here again, when designating a possible range of carbons, such as C-1 to C-20, as a non-limiting example, this range encompasses linear alkylenes starting with C-1 but only designates branched alkylenes, or cycloalkylene starting with C-3. These alkylene moieties may be substituted or unsubstituted as described below.

The term "aryl" or "aromatic groups" refers to such groups which contain 6 to 24 carbon atoms including phenyl, tolyl, xylyl, naphthyl, anthracyl, biphenyls, bisphenyls, tris-phenyls and the like. These aryl groups may further be substituted with any of the appropriate substituents, e.g., alkyl, alkoxy, acyl or aryl groups mentioned hereinabove.

Unless otherwise indicated in the text, the term "substituted" when referring to an aryl, alkyl, alkyloxy, fluoroalkyl, fluoroalkyloxy, fused aromatic ring, arene, heteroarene refers to one of these moieties which also contain with one or more substituents, selected from the group of unsubstituted alkyl, substituted alkyl, unsubstituted aryl, alkyloxyaryl (alkyl-O-aryl-), dialkyloxyaryl ((alkyl-O—)$_2$-aryl), haloaryl, alkyloxy, alkylaryl, haloalkyl, halide, hydroxyl, cyano, nitro, acetyl, alkylcarbonyl, formyl, ethenyl (CH$_2$=CH—), phenylethenyl (Ph-CH=CH—), arylethenyl (Aryl-CH=CH), and substituents comprising ethenylenearylene moieties (e.g., Ar(—CH=CH—Ar—)$_z$ where z is 1-3. Specific, non-limiting examples of substituted aryl and substituted aryl ethenyl substituent are as follows where " ∿∿∿ " represents the point of attachment:

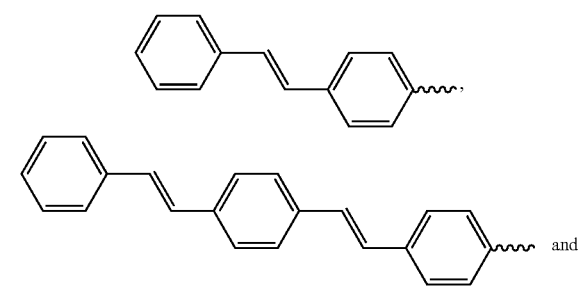

and

-continued

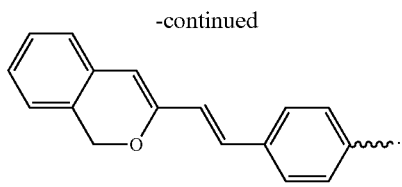

One aspect of this invention is compound of structure (I), wherein $R_2$ is H, a halide, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)(R 3)(R 4), wherein $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; $L_1$ and $L_2$ are independently a direct valence bond, or a C-1 to C-8 alkylene spacer group.

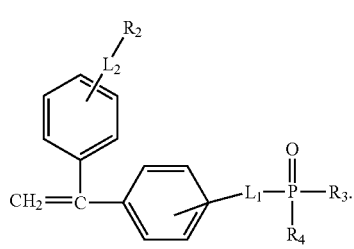

(I)

In another aspect of said compound of structure (I) $R_2$ is H, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)($R_3$)($R_4$), wherein $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; $L_1$ and $L_2$ are independently a direct valence bond, or a C-1 to C-8 alkylene spacer group.

In a further aspect, said above compound has structure (Ia), where $R_2$ is H, or —P(=O)($R_3$)($R_4$); $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and $L_1$ and $L_2$ are independently a direct valence bond, or a C-1 to C-8 alkylene spacer group. In another aspect of this embodiment $R_3$ is a C-1 to C-8 linear alkyl, a C-3 to C-8 branched alkyl, a C-3 to C-8 cyclic alkyl, C-1 to C-8 linear alkyloxy, a C-3 to C-8 branched alkyloxy or a C-3 to C-8 cyclic alkyloxy; $R_4$ is a C-1 to C-8 linear alkyloxy, a C-3 to C-8 branched alkyloxy or a C-3 to C-8 cyclic alkyloxy. In a further aspect of this embodiment $R_3$ and $R_4$ are independently selected from a C-1 to C-8 linear alkyloxy, a C-3 to C-8 branched alkyloxy or a C-3 to C-8 cyclic alkyloxy. In a still further embodiment of this aspect of the invention the compound is one wherein $L_1$ and $L_2$ are both a direct valence bond.

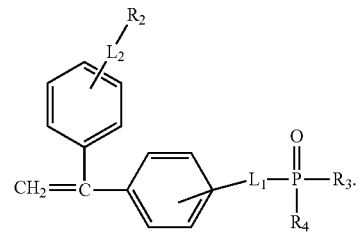

(Ia)

In another aspect, the compound of structure (I) has the more specific structure (Ib), wherein $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and $L_1$ is a direct valence bond, or a C-1 to C-8 alkylene spacer group. In another aspect of this embodiment $R_3$ is a C-1 to C-8 linear alkyl, a C-3 to C-8 branched alkyl, a C-3 to C-8 cyclic alkyl, C-1 to C-8 linear alkyloxy, a C-3 to C-8 branched alkyloxy or a C-3 to C-8 cyclic alkyloxy; $R_4$ is a C-1 to C-8 linear alkyloxy, a C-3 to C-8 branched alkyloxy or a C-3 to C-8 cyclic alkyloxy. In another more specific aspect of this embodiment $R_3$ and $R_4$ are independently selected from a C-1 to C-8 linear alkyloxy, a C-3 to C-8 branched alkyloxy or a C-3 to C-8 cyclic alkyloxy.

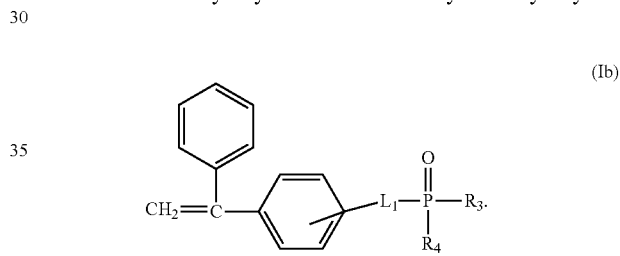

(Ib)

In a more specific embodiment of the compound of structure (Ib) it has structure (Ic). In one aspect of this embodiment $R_3$ and $R_4$ are independently selected from a C-1 to C-8 linear alkyloxy, a C-3 to C-8 branched alkyloxy or a C-3 to C-8 cyclic alkyloxy. In another aspect of this embodiment $R_3$ and $R_4$ are independently selected from a C-1 to C-8 linear alkyloxy. In another aspect $R_3$ and $R_4$ are ethyl. In another aspect $R_3$ and $R_4$ are methyl.

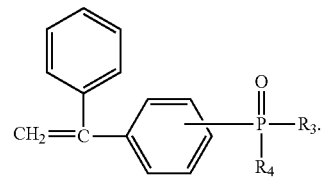

(Ic)

In a more specific embodiment of the compound of structure (Ib) it has structure (Id). In one aspect of this embodiment $R_3$ and $R_4$ are independently selected from a C-1 to C-8 linear alkyloxy, a C-3 to C-8 branched alkyloxy or a C-3 to C-8 cyclic alkyloxy. In another aspect of this embodiment $R_3$ and $R_4$ are independently selected from a C-1 to C-8 linear alkyloxy. In another aspect $R_3$ and $R_4$ are ethyl. In another aspect $R_3$ and $R_4$ are methyl.

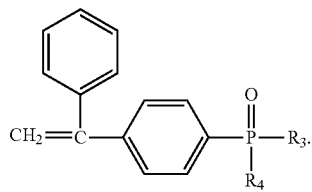
(Id)

In a more specific embodiment of the compound of structure (Ib) it has structure (Ie). In one aspect of this embodiment $R_3$ and $R_4$ are independently selected from a C-1 to C-8 linear alkyloxy, a C-3 to C-8 branched alkyloxy or a C-3 to C-8 cyclic alkyloxy. In another aspect of this embodiment $R_3$ and $R_4$ are independently selected from a C-1 to C-8 linear alkyloxy. In another aspect $R_3$ and $R_4$ are ethyl. In another aspect $R_3$ and $R_4$ are methyl.

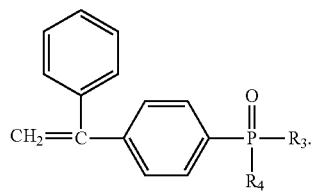
(Ie)

Another aspect of this invention is a polymer of structure (II) which has polydispersity ranging from 1 to about 1.1, wherein $R_1$ is H, a C-1 to C-8 linear alkyl, a C-3 to C-8 branched alkyl, a C-3 to C-8 cyclic alkyl, an aryl, or an alkylenearyl (i.e. -alkylene-aryl);
- $R_2$ is H, a halide, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)($R_3$)($R_4$) wherein, $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy;
- $L_1$ and $L_2$ are independently a direct valence bond, or a C-1 to C-8 alkylene spacer group;
- B is a direct valence bond, or a methylene spacer (—$CH_2$—); and
- A is a styrenic polymer chain, or an acrylic polymer chain.

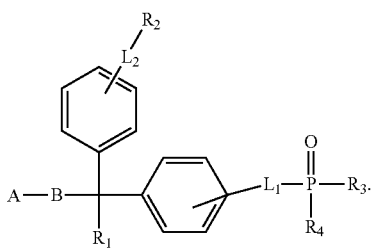
(II)

Another aspect of the polymer of structure (II) is one wherein $R_1$ is H; $R_2$ is H, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)($R_3$)($R_4$); $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and $L_1$ and $L_2$ are independently a direct valence bond, or a C-1 to C-8 alkylene spacer group and A is a styrenic polymer chain.

Another aspect of the polymer of structure (II) is one wherein it has structure (IIa), where $R_2$ is H, or —P(=O)($R_3$)($R_4$); $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and $L_1$ and $L_2$ are independently a direct valence bond, or a C-1 to C-8 alkylene spacer group. In another aspect of this embodiment $R_3$ is a C-1 to C-8 linear alkyl, a C-3 to C-8 branched alkyl, a C-3 to C-8 cyclic alkyl, C-1 to C-8 linear alkyloxy, a C-3 to C-8 branched alkyloxy or a C-3 to C-8 cyclic alkyloxy; and $R_4$ is a C-1 to C-8 linear alkyloxy, a C-3 to C-8 branched alkyloxy or a C-3 to C-8 cyclic alkyloxy. In yet another aspect of this embodiment $R_3$ is a C-1 to C-8 linear alkyl, a C-3 to C-8 branched alkyl, a C-3 to C-8 cyclic alkyl, C-1 to C-8 linear alkyloxy, a C-3 to C-8 branched alkyloxy or a C-3 to C-8 cyclic alkyloxy; $R_4$ is a C-1 to C-8 linear alkyloxy, a C-3 to C-8 branched alkyloxy or a C-3 to C-8 cyclic alkyloxy.

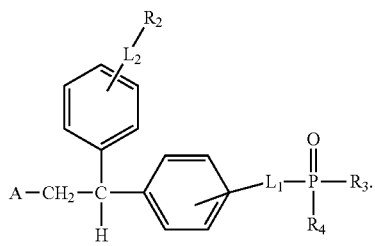
(IIa)

In another aspect of this polymer it is any of the above embodiment of said polymer in which it has structure (IIa), wherein $R_3$ is a C-1 to C-8 linear alkyl, a C-3 to C-8 branched alkyl, a C-3 to C-8 cyclic alkyl, C-1 to C-8 linear alkyloxy, a C-3 to C-8 branched alkyloxy or a C-3 to C-8 cyclic alkyloxy; and $R_4$ is a C-1 to C-8 linear alkyloxy, a C-3 to C-8 branched alkyloxy or a C-3 to C-8 cyclic alkyloxy. In another aspect of this polymer it is any of the above embodiment of said polymer in which it has structure (IIa), wherein $R_3$ and $R_4$ are independently selected from a C-1 to C-8 linear alkyloxy, a C-3 to C-8 branched alkyloxy or a C-3 to C-8 cyclic alkyloxy. In yet another aspect of this polymer it is any of the above embodiment of said polymer in which it has structure (IIa), wherein $L_1$ and $L_2$ are both a direct valence bond.

In another aspect of this polymer it is any of the above embodiment of said polymer in which it has structure (IIa), which has the more specific structure (IIb).

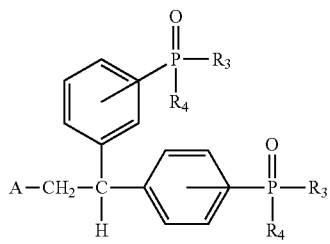

(IIb)

In another aspect of the polymer of structure (II), it has structure (IIc), wherein $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and $L_1$ is a direct valence bond, or a C-1 to C-8 alkylene spacer group. In another aspect of this embodiment, $R_3$ is a C-1 to C-8 linear alkyl, a C-3 to C-8 branched alkyl, a C-3 to C-8 cyclic alkyl, C-1 to C-8 linear alkyloxy, a C-3 to C-8 branched alkyloxy or a C-3 to C-8 cyclic alkyloxy; and $R_4$ is a C-1 to C-8 linear alkyloxy, a C-3 to C-8 branched alkyloxy or a C-3 to C-8 cyclic alkyloxy. In another aspect of this embodiment $R_3$ is a C-1 to C-8 linear alkyl, a C-3 to C-8 branched alkyl, a C-3 to C-8 cyclic alkyl, C-1 to C-8 linear alkyloxy, a C-3 to C-8 branched alkyloxy or a C-3 to C-8 cyclic alkyloxy; and $R_4$ is a C-1 to C-8 linear alkyloxy, a C-3 to C-8 branched alkyloxy or a C-3 to C-8 cyclic alkyloxy. In a further aspect of this embodiment $R_3$ and $R_4$ are independently selected from a C-1 to C-8 linear alkyloxy, a C-3 to C-8 branched alkyloxy or a C-3 to C-8 cyclic alkyloxy.

In another aspect of the polymer of structure (IIc), it has structure (IIe). In one aspect of this embodiment $R_3$ and $R_4$ are independently selected from a C-1 to C-8 linear alkyloxy, a C-3 to C-8 branched alkyloxy or a C-3 to C-8 cyclic alkyloxy. In another aspect of this embodiment $R_3$ and $R_4$ are independently selected from a C-1 to C-8 linear alkyloxy. In another aspect $R_3$ and $R_4$ are ethyl. In another aspect $R_3$ and $R_4$ are methyl.

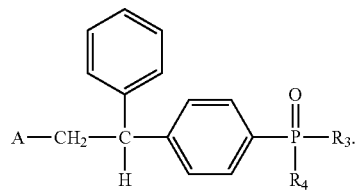

(IIe)

In another aspect of the polymer of structure (II) $R_1$ is a C-1 to C-8 linear alkyl, a C-3 to C-8 branched alkyl or a C-3 to C-8 cyclic alkyl, an aryl, an alkylenearyl (i.e. -alkylene-aryl); $R_2$ is H, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)($R_3$)($R_4$); $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; $L_1$ and $L_2$ are independently a direct valence bond, or a C-1 to C-8 alkylene spacer group; A is an acrylic polymer chain.

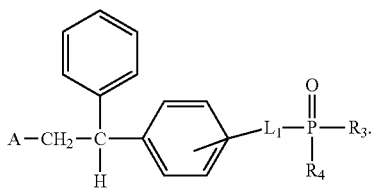

(IIc)

In another aspect of the polymer of structure (IIc), it has structure (IId). In one aspect of this embodiment $R_3$ and $R_4$ are independently selected from a C-1 to C-8 linear alkyloxy, a C-3 to C-8 branched alkyloxy or a C-3 to C-8 cyclic alkyloxy. In another aspect of this embodiment $R_3$ and $R_4$ are independently selected from a C-1 to C-8 linear alkyloxy. In another aspect $R_3$ and $R_4$ are ethyl. In another aspect $R_3$ and $R_4$ are methyl.

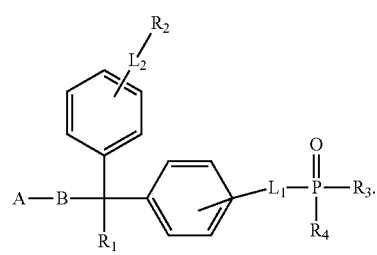

(II)

In another aspect of the polymer of structure (II) it has structure (IIf), wherein $R_{alk}$ is a C-1 to C-8 linear alkyl, a C-3 to C-8 branched alkyl, a C-3 to C-8 cyclic alkyl; $R_2$ is H, or —P(=O)($R_3$)($R_4$); $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and $L_1$ and $L_2$ are independently a direct valence bond, or a C-1 to C-8 alkylene spacer group. In another aspect of this embodiment $R_3$ is a C-1 to C-8 linear alkyl, a C-3 to C-8 branched alkyl, a C-3 to C-8 cyclic alkyl, C-1 to C-8 linear alkyloxy, a C-3 to C-8 branched alkyloxy or a C-3 to C-8 cyclic alkyloxy; $R_4$ is a C-1 to C-8 linear alkyloxy, a C-3 to C-8 branched alkyloxy or a C-3 to C-8 cyclic alkyloxy. In yet another embodiment of this aspect, $R_3$ and $R_4$ are independently selected from a C-1 to C-8 linear alkyloxy, a C-3 to C-8 branched alkyloxy or a C-3 to C-8 cyclic alkyloxy. In

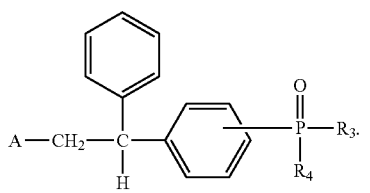

(IId)

still another aspect of this embodiment $L_1$ and $L_2$ are both a direct valence bond. In a further embodiment of this aspect it has structure (IIg).

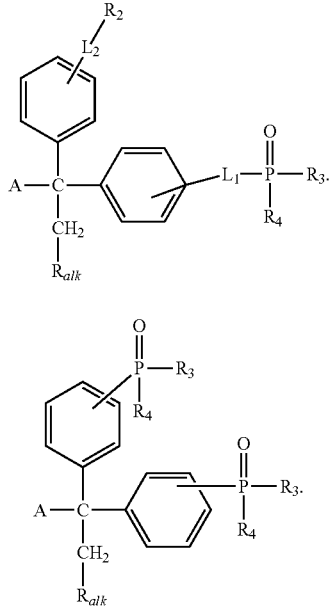

(IIf)

(IIg)

In another embodiment of the polymer of structure (II) it has structure (IIh), where $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; $L_1$ is a direct valence bond, or a C-1 to C-8 alkylene spacer group. In another more specific embodiment of this aspect $R_3$ is a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; $R_4$ is a C-1 to C-8 linear alkyloxy, a C-3 to C-8 branched alkyloxy or a C-3 to C-8 cyclic alkyloxy. In another more specific embodiment of this aspect $R_3$ and $R_4$ are independently selected from a C-1 to C-8 linear alkyloxy, a C-3 to C-8 branched alkyloxy or a C-3 to C-8 cyclic alkyloxy. In another aspect of this embodiment $L_1$ is a direct valence bond and the polymer of structure (II) has structure (IIi). In another aspect of this embodiment it has structure (IIj).

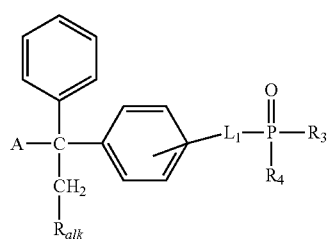

(IIh)

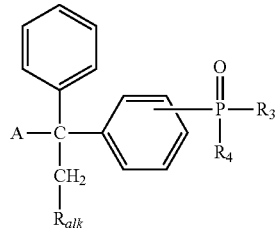

(IIi)

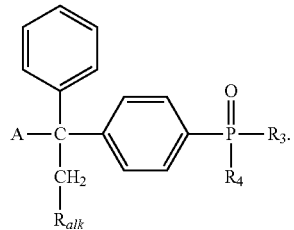

(IIj)

In one aspect of the above described embodiments of this invention wherein said polymer has structures (II), said polymer a is a styrenic polymer having structure (III), where $R_{e1}$ is H, a C-1 to C-8 linear alkyl, a C-3 to C-8 branched alkyl, a C-3 to C-8 cyclic alkyl, an aryl, or an alkylenearyl (i.e. -alkylene-aryl); $R_2$ is H, a halide, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or $-P(=O)(R_3)(R_4)$;

$R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy;

$L_1$ and $L_2$ are independently a direct valence bond, or a C-1 to C-8 alkylene spacer group;

$R_5$ is H, a C-1 to C-4 linear alkyl; $R_6$ is H, a halide, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; n is the number of repeat units; and further where said styrenic polymer has a polydispersity ranging from 1 to 1.1.

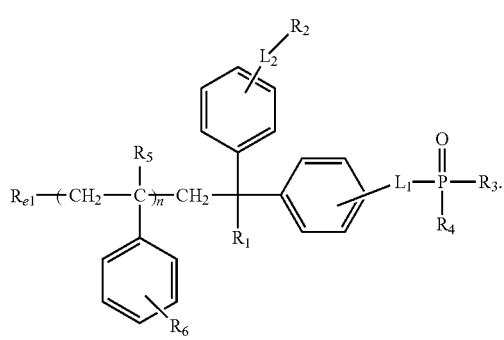

(III)

In one aspect of the styrenic polymer of structure (III), Rei is H; $R_2$ is H, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)(R$_3$)(R$_4$); R$_3$ and R$_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and L$_1$ and L$_2$ are independently a direct valence bond, or a C-1 to C-8 alkylene spacer group.

In one aspect of the styrenic polymer of structures (III) described above, it has structure (IIIa), where R$_2$ is H, or —P(=O)(R$_3$)(R$_4$); R$_3$ and R$_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; L$_1$ and L$_2$ are independently a direct valence bond, or a C-1 to C-8 alkylene spacer group.

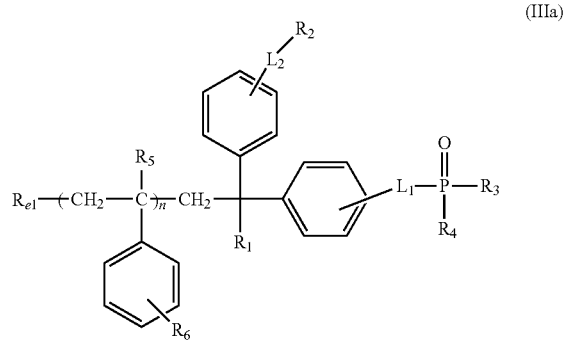

(IIIa)

In one aspect of the styrenic polymer of structure (IIIa), R$_3$ is a C-1 to C-8 linear alkyl, a C-3 to C-8 branched alkyl, a C-3 to C-8 cyclic alkyl, C-1 to C-8 linear alkyloxy, a C-3 to C-8 branched alkyloxy or a C-3 to C-8 cyclic alkyloxy; R$_4$ is a C-1 to C-8 linear alkyloxy, a C-3 to C-8 branched alkyloxy or a C-3 to C-8 cyclic alkyloxy.

In another aspect of the above described embodiments of the styrenic polymer of structure (IIIa), R$_3$ and R$_4$ are independently selected from a C-1 to C-8 linear alkyloxy, a C-3 to C-8 branched alkyloxy or a C-3 to C-8 cyclic alkyloxy. In one aspect of this embodiment L$_1$ and L$_2$ are both a direct valence bond.

In another aspect of the above described styrenic polymer it has structure (IIIb); wherein the substituents R$_{e1}$, R$_5$, R$_6$, R$_4$, R$_3$ may be varied in different embodiments and n and the polydispersity may be varied as described above for structures (III) and (IIIa).

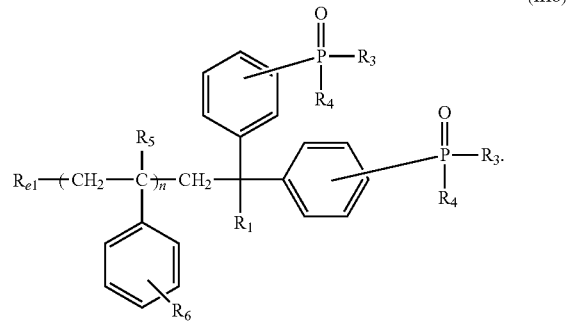

(IIIb)

In another aspect of the above described styrenic polymer it has structure (IIIc), wherein the substituents R$_{e1}$, R$_5$, R$_6$, R$_4$, R$_3$ and n and the polydispersity may be varied as described above for structures (III) and (IIIa). In one specific embodiment of this aspect, R$_3$ and R$_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and L$_1$ is a direct valence bond, or a C-1 to C-8 alkylene spacer group. In one specific embodiment of this aspect R$_3$ is a C-1 to C-8 linear alkyl, a C-3 to C-8 branched alkyl, a C-3 to C-8 cyclic alkyl, C-1 to C-8 linear alkyloxy, a C-3 to C-8 branched alkyloxy or a C-3 to C-8 cyclic alkyloxy; and R$_4$ is a C-1 to C-8 linear alkyloxy, a C-3 to C-8 branched alkyloxy or a C-3 to C-8 cyclic alkyloxy. In another aspect of this embodiment R$_3$ and R$_4$ are independently selected from a C-1 to C-8 linear alkyloxy, a C-3 to C-8 branched alkyloxy or a C-3 to C-8 cyclic alkyloxy. In yet another aspect of this embodiment it has structure (IIId) whose substituent may be varied as described above for this embodiment. In another aspect of this embodiment it has structure (IIIe).

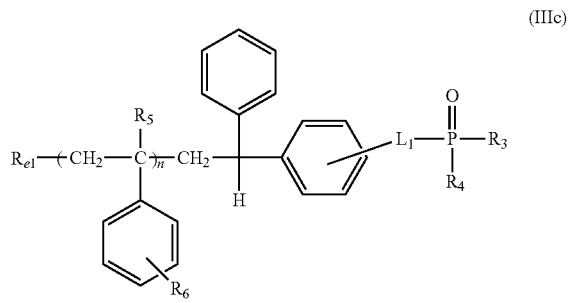

(IIIc)

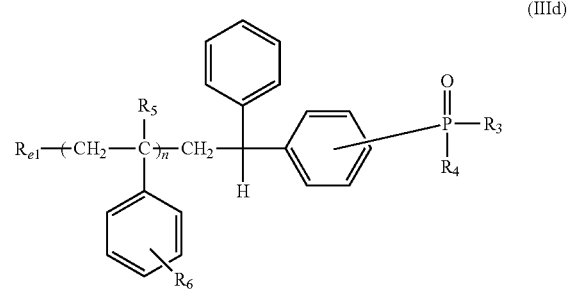

(IIId)

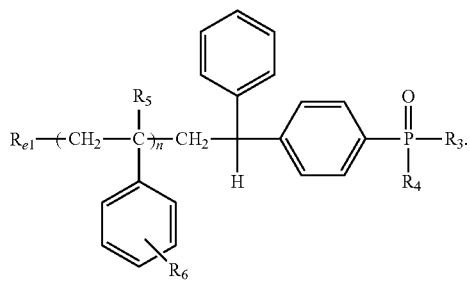

(IIIe)

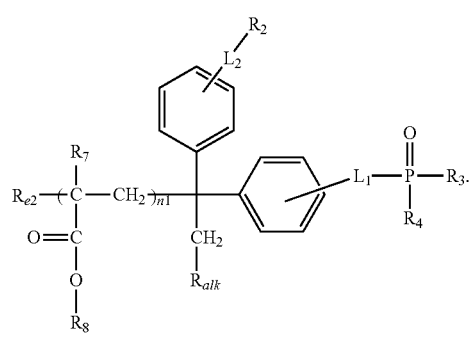

(IV)

In another aspect of this invention the inventive polymer described above is an acrylic polymer having structure (IV), wherein $R_{alk}$ is a C-1 to C-8 linear alkyl, a C-3 to C-8 branched alkyl or a C-3 to C-8 cyclic alkyl; $R_2$ is H, a halide, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)($R_3$)($R_4$); $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; $L_1$ and $L_2$ are independently a direct valence bond, or a C-1 to C-8 alkylene spacer group; $R_7$ is H or a C-1 to C-4 linear alkyl; $R_8$ is a C-1 to C-8 linear alkyl, a C-3 to C-8 branched alkyl or a C-3 to C-8 cyclic alkyl; $R_{e2}$ is and end group selected from H, a C-1 to C-8 linear alkyl, a C-3 to C-8 branched alkyl, or a C-3 to C-8 cyclic alkyl; n1 is the number of repeat units in said acrylate polymer; and further where said acrylic polymer has a polydispersity ranging from 1 to 1.1. In one aspect of this embodiment $R_{alk}$ is a C-1 to C-8 linear alkyl, a C-3 to C-8 branched alkyl, a C-3 to C-8 cyclic alkyl; $R_2$ is H, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)($R_3$)($R_4$); $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and $L_1$ and $L_2$ are independently a direct valence bond, or a C-1 to C-8 alkylene spacer. In another aspect of this embodiment, $R_{alk}$ is a C-1 to C-8 linear alkyl, a C-3 to C-8 branched alkyl, a C-3 to C-8 cyclic alkyl; $R_2$ is H, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)($R_3$)($R_4$); $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and $L_1$ and $L_2$ are independently a direct valence bond, or a C-1 to C-8 alkylene spacer group.

In another aspect, the above described acrylic polymer has structure (IVa); wherein the substituents $R_{e2}$, $R_7$, $R_8$ and n1 and the polydispersity may be varied as described above for said acrylic polymer having structure (IV), and further where $R_{alk}$ is a C-1 to C-8 linear alkyl, a C-3 to C-8 branched alkyl, a C-3 to C-8 cyclic alkyl; $R_2$ is H, or —P(=O)($R_3$)($R_4$); $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; $L_1$ and $L_2$ are independently a direct valence bond, or a C-1 to C-8 alkylene spacer group. In a further aspect of this embodiment $R_3$ is a C-1 to C-8 linear alkyl, a C-3 to C-8 branched alkyl, a C-3 to C-8 cyclic alkyl, C-1 to C-8 linear alkyloxy, a C-3 to C-8 branched alkyloxy or a C-3 to C-8 cyclic alkyloxy; and $R_4$ is a C-1 to C-8 linear alkyloxy, a C-3 to C-8 branched alkyloxy or a C-3 to C-8 cyclic alkyloxy. In another aspect of this embodiment $R_3$ is a C-1 to C-8 linear alkyl, a C-3 to C-8 branched alkyl, a C-3 to C-8 cyclic alkyl, C-1 to C-8 linear alkyloxy, a C-3 to C-8 branched alkyloxy or a C-3 to C-8 cyclic alkyloxy; and $R_4$ is a C-1 to C-8 linear alkyloxy, a C-3 to C-8 branched alkyloxy or a C-3 to C-8 cyclic alkyloxy. In a further aspect of this embodiment $R_3$ and $R_4$ are independently selected from a C-1 to C-8 linear alkyloxy, a C-3 to C-8 branched alkyloxy or a C-3 to C-8 cyclic alkyloxy. In still another embodiment wherein $L_1$ and $L_2$ are both a direct valence bond. In still another embodiment, the polymer has structure (IVb).

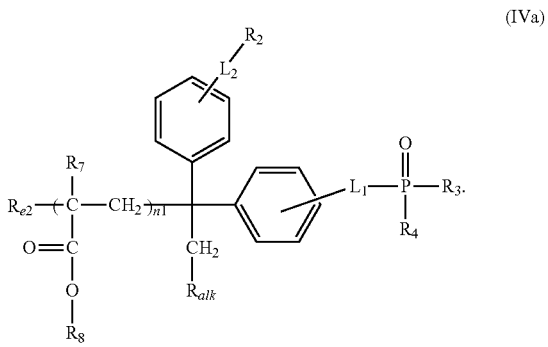

(IVa)

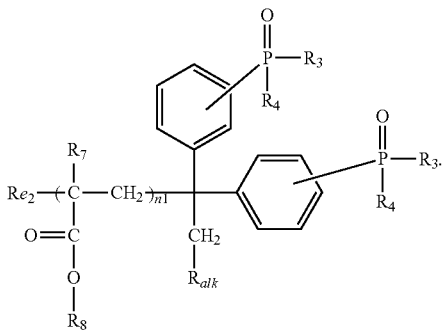

(IVb)

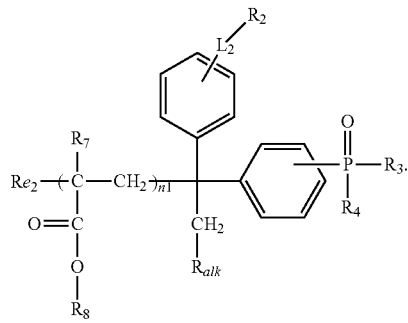

(IVd)

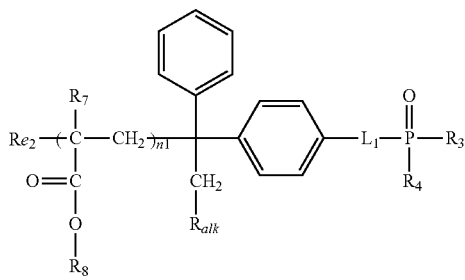

(IVe)

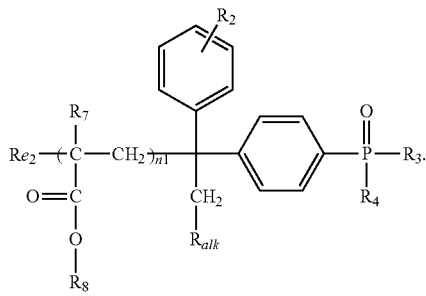

(IVf)

In another aspect, the above described acrylic polymer has structure (IVc); wherein the substituents $R_{e2}$, $R_7$, $R_8$ and n1 and the polydispersity may be varied as described above in said acrylic polymer, $R_3$ and $R_4$ are independently an aryl, an alkylenearyl (i.e. -alkylene-aryl), a C-2 to C-8 alkyleneoxyalkyl (i.e. -alkylene-O-alkyl), a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and $L_1$ is a direct valence bond, or a C-1 to C-8 alkylene spacer group. In one aspect of this embodiment $R_3$ is a C-1 to C-8 linear alkyl, a C-3 to C-8 branched alkyl, a C-3 to C-8 cyclic alkyl, C-1 to C-8 linear alkyloxy, a C-3 to C-8 branched alkyloxy or a C-3 to C-8 cyclic alkyloxy; and $R_4$ is a C-1 to C-8 linear alkyloxy, a C-3 to C-8 branched alkyloxy or a C-3 to C-8 cyclic alkyloxy. In still another aspect of this embodiment $R_3$ and $R_4$ are independently selected from a C-1 to C-8 linear alkyloxy, a C-3 to C-8 branched alkyloxy or a C-3 to C-8 cyclic alkyloxy. In yet another aspect of the described acrylic polymer, $L_1$ is a direct valence bond and $L_2$ is a direct valence bond or a C-1 to C-8 alkylene spacer group, $R_2$ is H, a halide, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)($R_3$)($R_4$), and the polymer has structure (IVd). In a more specific aspect of the embodiment where it has structure (IVc), it has structure (IVe). In a more specific embodiment where it has structure (IVd), it has structure (IVf), where $R_2$ is H, a halide, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)($R_3$)($R_4$).

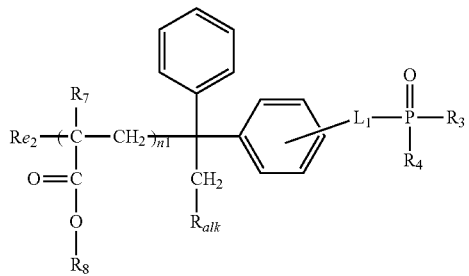

(IVc)

Another aspect of this invention is a composition which comprises any one of the above described inventive polymer and an organic spin casting solvent.

In the above embodiments of the novel compositions, the organic spin casting solvent is one which can dissolve said novel polymers and any other additional optional components as noted above. This organic spin casting solvent may be a single solvent or a mixture of solvents. Suitable solvents are organic solvent which may include, for example, a glycol ether derivative such as ethyl cellosolve, methyl cellosolve, propylene glycol monomethyl ether (PGME), diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate (PGMEA); carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate (EL), ethyl glycolate, and ethyl-3-hydroxy propionate; a ketone ester such as methyl pyruvate or ethyl pyruvate; an alkyloxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; a ketal or acetal like 1,3 dioxalane and diethoxypropane; lactones such as butyrolactone; an amide derivative such as dimethylacetamide or dimethylformamide, anisole, and mixtures thereof.

The novel compositions, in addition to the polymer and the solvent, may contain surfactants as additives to facilitate coating.

Another aspect of said invention is novel compositions wherein said novel polymers are present in an amount of from about 0.1 wt % to about 10 wt % of the total weight of said composition including the organic spin casting solvent. In another aspect it is present in an amount of from about 0.1 wt % to about 2 wt %. In yet another embodiment it is present in an amount of from about 0.5 wt % to about 1.5 wt %. In yet another embodiment it is present in an amount of from about wt % to about 1.5 wt %. In yet another embodiment it is present in an amount of about 1 wt %.

Another aspect of this invention is a process of forming a pinning layer brush selectively on a substrate which comprises both metallic surface areas and a non-metallic surface area, comprising the steps:
i) coating a composition as described above, on said substrate, forming a film,
ii) baking said film at a temperature from about 120° C. to about 250° C. for about 1 minute to about 1 hour, to form a baked film,
iii) washing said baked film with a solvent to remove ungrafted polymer, forming a pinning layer brush only on said metallic surface areas of said substrate.

Another aspect of the process comprising the steps i) to iii) is one wherein in step ii) said baking is done from about 1 minute to about 30 minutes. In yet another aspect of this embodiment in step ii) the film is baked at about 150° C. to about 170° C. In a further aspect of this embodiment, it is baked at about 180° C. In yet another aspect it is baked for about 30 minutes.

Another aspect of said process of forming a pinning layer brush selectively is one where said metallic surface areas are selected from the group consisting of Cu, Au, Ag, W, Ta, Nb, Fe, Ni, Co, Mo, Al, Pt, Rh, Pb, Cd, Ti, Zr, Hf, and Ru and said non-metallic surface areas are selected from the group consisting of Si, SiOx (silicon oxide), SiNx (silicon nitride), SiON (silicon oxynitride) and organic dielectric substrates.

Another aspect of this invention is a process comprising the steps;
ia) coating a composition as described above, on a substrate which comprises both metallic surface areas and non-metallic surface areas, forming a film,
iia) baking said film at a temperature from about 120° C. to about 250° C. for about 1 minute to about 1 hour, to form a baked film,
iiia) washing said baked film with a solvent to remove ungrafted polymer, forming a grafted substrate wherein pinning layer brushes are only present on said metallic surface areas of said substrate,
iva) coating said grafted substrate with a neutral layer composition, forming a neutral layer coating,
va) curing said neutral layer coating,
via) washing away, with a solvent, uncured neutral layer, leaving in said non-metallic areas of said substrate a neutral directing brush, forming on said substrate a chemoepitaxy directing layer,
viia) coating said chemoepitaxy directing layer with a block copolymer solution, forming a coating of block copolymer,
viiia) annealing said coating of block copolymer, to form a directed self-assembled film of the block copolymer on said chemoepitaxy directing layer.

Another aspect of the process comprising the step ia) to viiia) is one wherein in step iia) said baking is done from about 1 minute to about 30 minutes. In yet another aspect of this embodiment in step iia) the film is baked at about 150° C. to about 170° C. In a further aspect of this embodiment in it is baked at about 180° C. In yet another aspect it is baked for about 30 minutes.

Another aspect of the process comprising the step ia) to viiia) is one wherein for said substrate, said metallic surface areas are Tungsten and said non-metallic surface areas are silicon or silicon oxide.

Another aspect of the process comprising the step ia) to viiia) is one wherein said block copolymer is a block copolymer comprised of styrenic repeat units and alkyl acrylic repeat units.

Another aspect of the process comprising the step ia) to viia) is one wherein said block copolymer is either an AB diblock copolymer of alkyl acrylic repeat unit and styrenic repeat units, or an ABA triblock copolymer of alkyl acrylic repeat unit and styrenic repeat units.

Specific non-limiting examples of block copolymers are poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination comprising at least one of the above described block copolymers. All these polymeric materials share in common the presence of at least one block which is rich in repeat units resistant to etching techniques typically employed in manufacturing IC devices and at least one block which etches rapidly under these same conditions. This allows for the self-assembled polymer pattern to transfer onto the substrate.

Another aspect of this invention is the use of a compound of formula (I) as described above for the preparation of a polymer as described above.

Another aspect of this invention is the use of a polymer or composition as described above for forming a pinning layer brush on a substrate.

EXAMPLES

Reference will now be made to more specific embodiments of the present disclosure and experimental results that provide support for such embodiments. The examples are given below to more fully illustrate the disclosed subject matter and should not be construed as limiting the disclosed subject matter in any way.

It will be apparent to those skilled in the art that various modifications and variations can be made in the disclosed subject matter and specific examples provided herein without departing from the spirit or scope of the disclosed subject matter. Thus, it is intended that the disclosed subject matter, including the descriptions provided by the following examples, covers the modifications and variations of the disclosed subject matter that come within the scope of any claims and their equivalents.

Synthesis of DPE-phosphonate (I to IV)

Example 1: Synthesis of Diethyl 4-(1,1-diphenylethylene) phosphonate (DPE-I) (Described in Scheme 1)

A 1 L 2-neck flask and magnetic bar were well dried in an oven under vacuum. 82 g (223 mmol) of methyltriphenylphosphonium bromide was added, dried at vacuum and then charged with nitrogen. 600 mL of THF was added and the reaction vessel was cooled with an ice bath. After 156 mL of n-butyllithium (1.6 M in hexane, 249 mmol) was slowly added to the vessel under ice bath cooling, the vessel temperature naturally increased to RT by removal of ice bath. The reaction was maintained for one hour until most solid disappeared (Produced ylide is soluble in THF). During ylide reaction, the solution of 50 g (192 mmol) of 4-bromobenzophenone in 100 mL of THF in a separate 2-neck flask was prepared. 4-bromobenzophenone solution was transferred into ylide reaction vessel by cannula under ice bath and the reaction was stirred for 1 or 2 hours. The reaction was quenched with water and diluted with ethyl acetate. Mixture was extracted with 1% aq. HCl and aq. NaCl solution and dried with $MgSO_4$. After filtering off $MgSO_4$, the solution was concentrated by rotavap. White solid triphenylphosphonium oxide was precipitated by adding 2/1 Hexane-to-ethyl acetate and filtered off. Then solution was concentrated again. 43 g (92.7%) of colorless liquid product, 4-(1,1-diphenylethylene)-Br (I) was obtained by silica column chromatography with hexane followed by solvent evaporation and drying under vacuum. 13 g (51.7 mmol) of 4-Bromo-DPE (I) was added to a 500 mL two-neck flask and charged with nitrogen and dissolved in 200 mL of THF. 35.5 mL (56.9 mmol) of 1.6 M nBuLi was slowly added at −78° C. bath and the reaction was left for 10 min at same temperature. In a separate 500 mL 2-neck flask, 9.7 mL (67.2 mmol) of diethyl chlorophosphate was added under nitrogen. 100 mL of THF was added and solution was cooled down to −78° C. Lithiated DPE solution was transferred to the separate diethylchlorophosphate in THF via cannula for 20 minutes. The solution was stirred for 30 min, then diluted with ethyl acetate and washed with water. The water layer was extracted with ethyl acetate and combined organic layers were dried with $MgSO_4$. After filtering to remove $MgSO_4$, the organic layer was concentrated by evaporating solvents. 12.5 g (76.3%) of light-yellow oil was obtained by silica column chromatography through 50% hexane in ethyl acetate. $^1$H NMR (400 MHz, $CDCl_3$), ppm(δ), 7.81 (1H, dd, J=6.0 Hz), 7.79 (1H, dd, J=6.0 Hz), 7.47-7.44 (2H, m), 7.37-7.32 (5H, m), 5.57 (1H, s), 5.55 (1H, s), 4.21-4.12 (4H, m), 1.37 (6H, t, J=5.3 Hz).

Example 2: Synthesis of Dimethyl 4-(1,1-diphenylethylene) phosphonate (DPE-II)) (Described in Scheme 2)

Synthesis was similarly followed by the procedure of example 1 except using dimethyl chlorophosphate instead of diethyl chlorophosphate. $^1$H NMR (400 MHz, $CDCl_3$), ppm(δ), 7.81 (1H, dd, J=6.1 Hz), 7.77 (1H, dd, J=6.1 Hz), 7.49-7.46 (2H, m), 7.38-7.32 (5H, m), 5.58 (1H, s), 5.55 (1H, s), 3.83 (3H, s), 3.80 (3H, s).

Example 3: Synthesis of Phenyl Ethyl 4-(1,1-diphenylethylene) phosphinate (DPE-III) (Described in Scheme 3)

25 g of diethyl 4-(1,1-diphenyleneethylene) phosphate (DPE-I) was added to 500 mL flask and oxalyl chloride was slowly added followed by a few drops of dimethylformamide at ice bath. The reaction solution was kept stirring overnight at 50° C. by letting gas evolve in fume hood. After removing all residue, excessive oxalyl chloride and solvent by evaporation, phenylmagnesium bromide (2M in diethyl ether) was slowly added in THF solution at −78° C. and the temperature was raised to RT gradually. The solution was diluted with ethyl acetate and washed with water. Water layer was extracted with ethyl acetate and combined organic layers were dried with $MgSO_4$. Filtered organic layer by removing $MgSO_4$ was concentrated by evaporating solvents. 14.5 g of light-yellow oil was obtained by silica column chromatography with 30% hexane in ethyl acetate. $^1$H NMR (400 MHz, $CDCl_3$), ppm(δ), 7.89-7.77 (4H, m), 7.57-7.42 (5H, m), 7.36-7.30 (5H, m), 5.55 (1H, s), 5.53 (1H, s), 4.19-4.12 (2H, m), 1.39 (3H, t, J=9.18 Hz).

Example 4: Synthesis of Ethyl Ethyl 4-(1,1-diphenylethylene) phosphinate (DPE-IV)) (Described in Scheme 4)

Synthesis was similarly followed by the procedure of example 2 using ethylmagnesium chloride (2M in diethyl ether) instead of phenylmagnesium bromide. $^1$H NMR (400 MHz, $CDCl_3$), ppm(δ), 7.77 (1H, dd, J=6.18 Hz), 7.75 (1H, dd, J=6.18 Hz), 7.48 (1H, dd, J=6.13 Hz), 7.47 (1H, dd, J=6.13 Hz), 7.40-7.32 (5H, m), 5.57 (1H, s), 5.56 (1H, s), 4.17-4.11 (1H, m), 3.95-3.89 (1H, m), 2.0-1.87 (3H, m), 1.34 (3H, t, J=5.3 Hz), 1.18 (3H, t, J=5.8 Hz), 1.13 (3H, t, J=5.8 Hz).

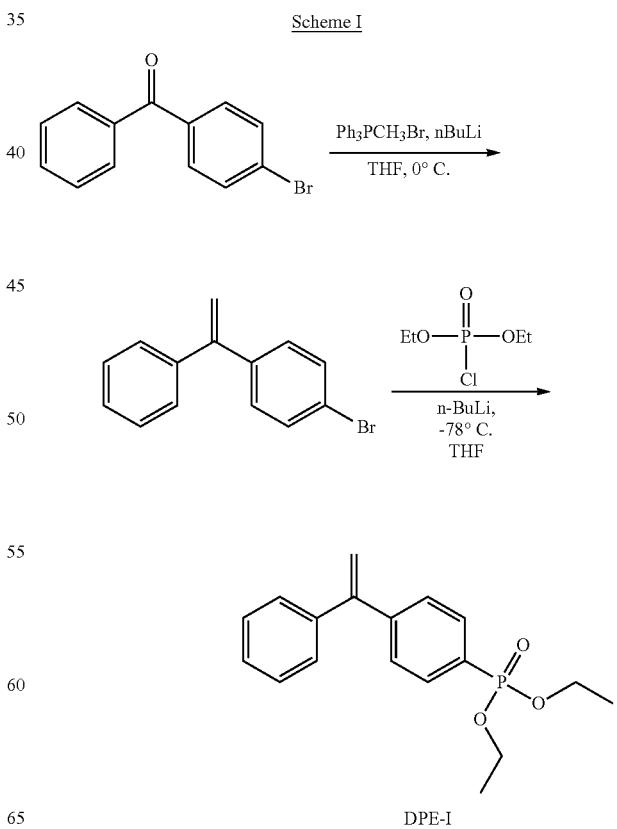

Scheme I

DPE-I

Scheme 2
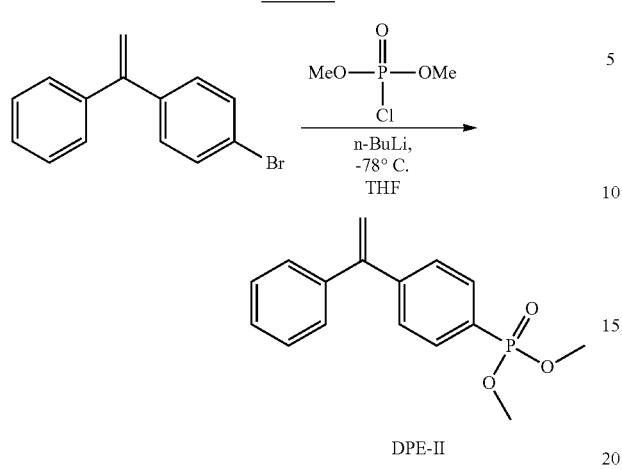
DPE-II
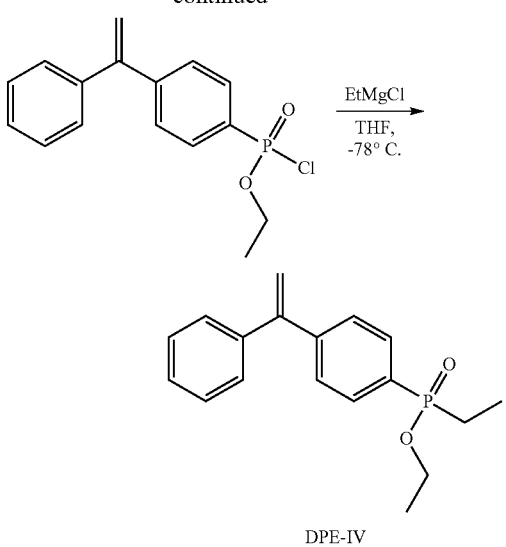
DPE-IV
Scheme 3
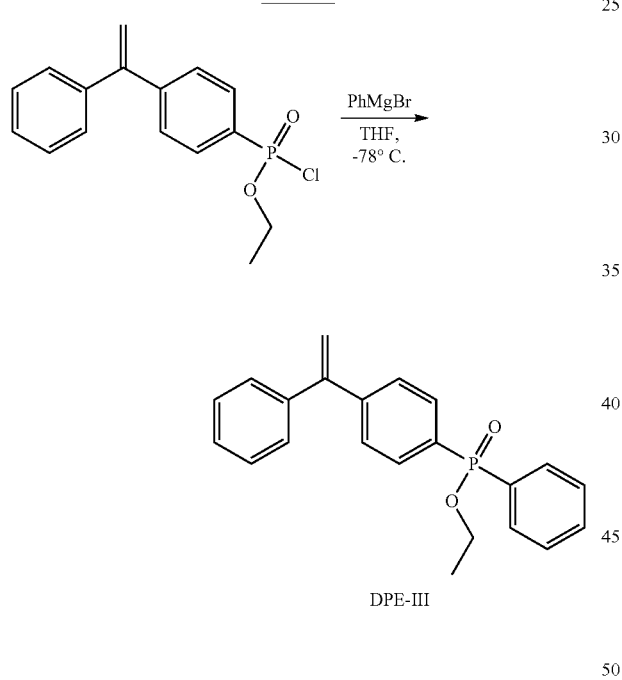
DPE-III
Scheme 4
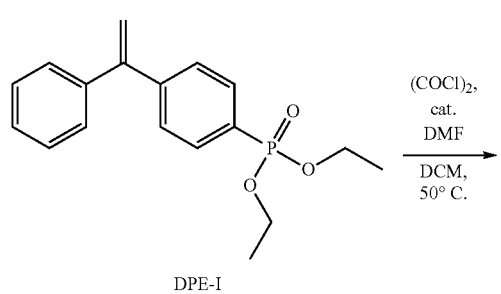
DPE-I
Scheme 5
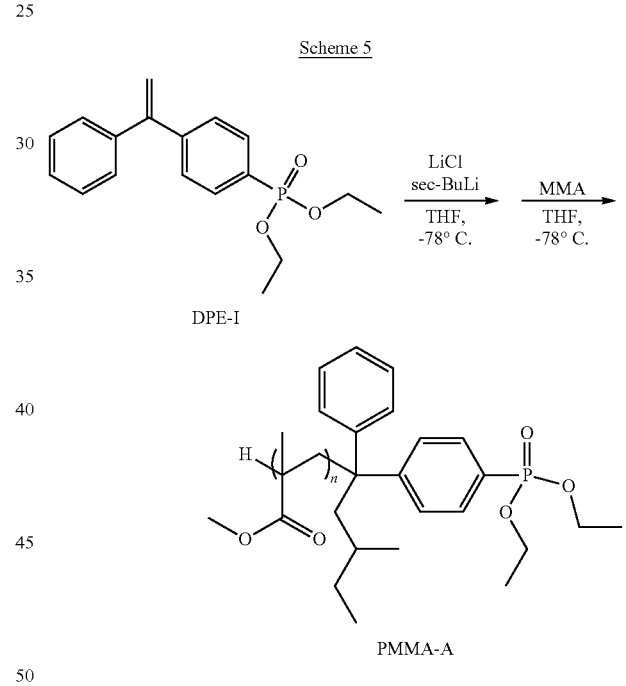
DPE-I
PMMA-A
Scheme 6
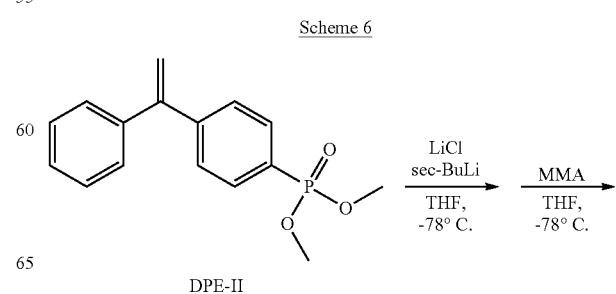
DPE-II 29
-continued
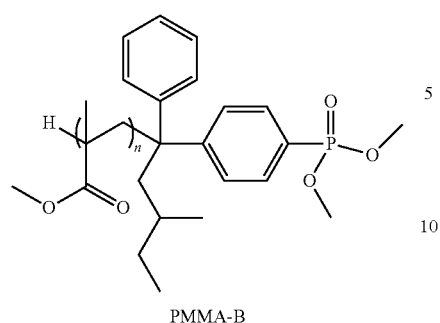
30
-continued
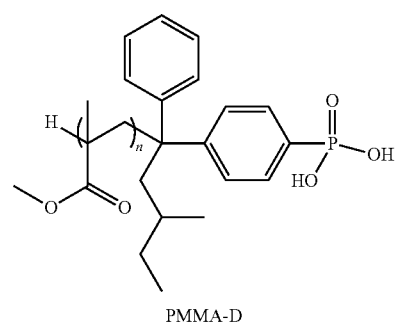
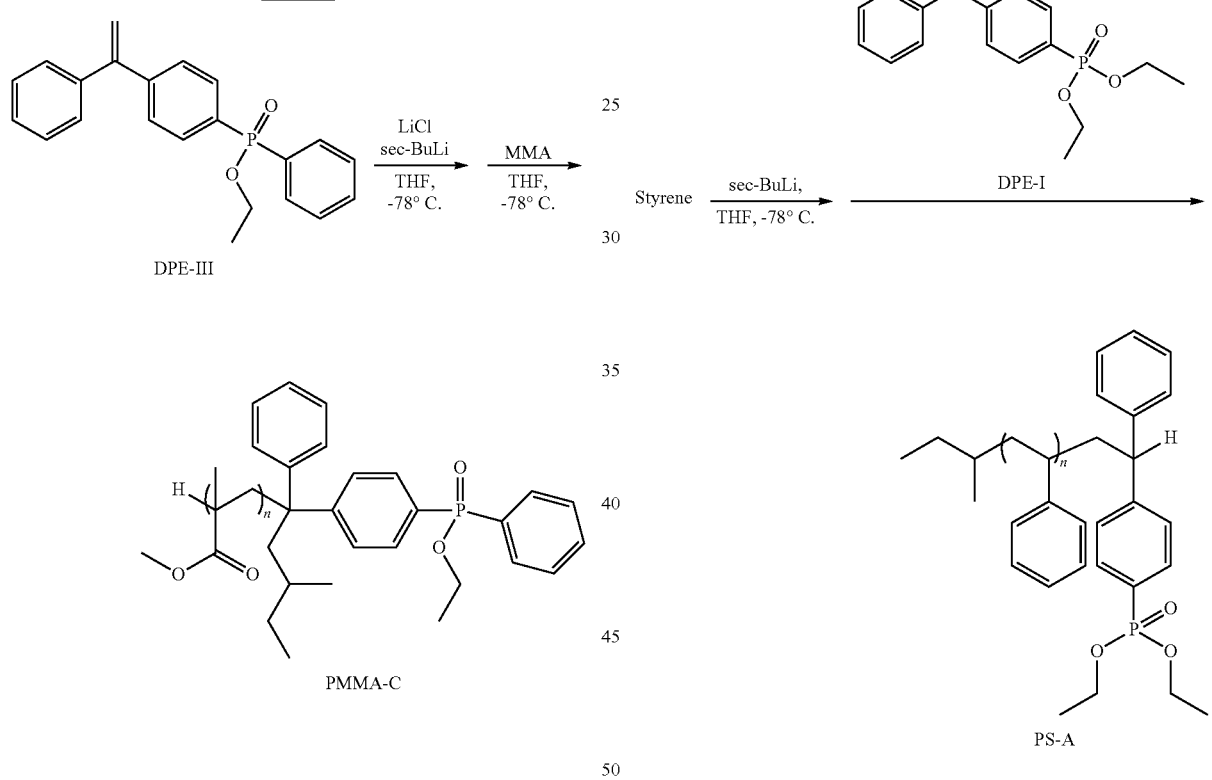
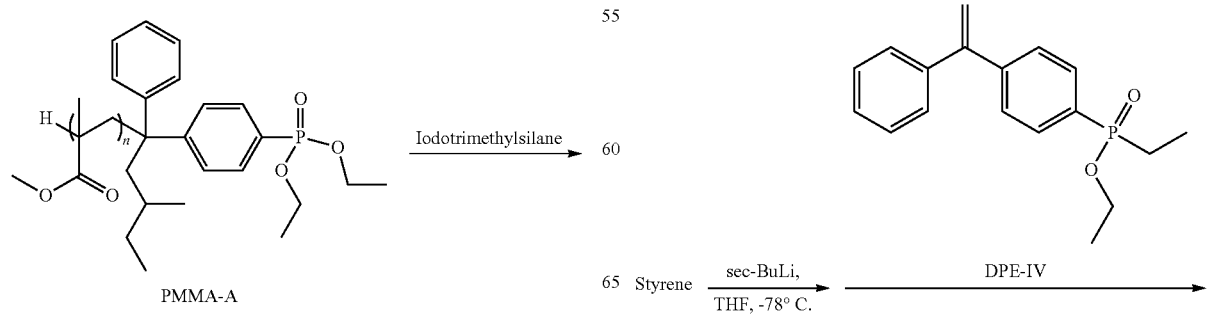

-continued

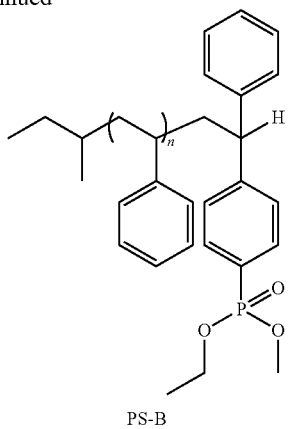

PS-B

Scheme 11

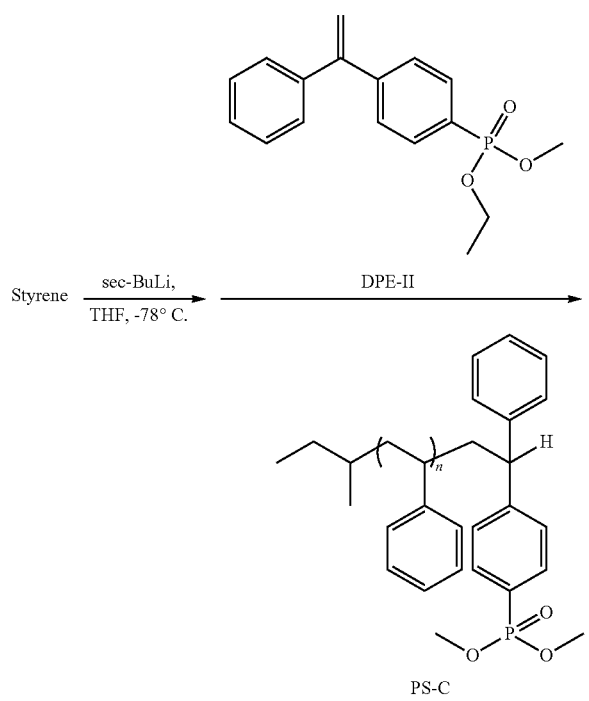

Example 5: Synthesis of PMMA Capped with Diethyl 4-(1,1-Diphenylethylene) Phosphonate (PMMA-A) (Described in Scheme 5)

25 mL of MMA (alumina column passed and degassed) was taken into a calibrated ampule provided with two Rota flow stopcocks and 19F connecting glass joint. After careful degassing under dynamic vacuum while MMA kept at low temperature, desired amount of MMA (25 mL) of monomer was collected and ampule was closed under vacuum with stopcock. In the glovebox, required amount of diethyl 4-(1,1-diphenylethylene) phosphonate (DPE-I) was weighed (1.2 molar excess with respect to Sec-BuLi) in a vial and dissolved in ~5-10 mL toluene and transferred in a calibrated ampule provided with single Rota flow-stopcock and 19F joint. This solution was promptly titrated with dilute hexylDPE-Li solution (toluene solution containing 2 wt.-% of 1,1'-diphenylethylene and an equimolar amount of sec-butyllithium, which form an anionic complex) until a pale orange/red color was persistence. Solution color got weaker and then maintained to yellow. After closing the stopcock ampule was removed from glovebox. Both MMA ampule and DPE ampule were attached to the flask using glass joints and yellow grease. The required amount of LiCl (10 times excess with respect to Sec-BuLi) was weighed and quickly added to the flask and closed with three-way septum adaptor, which was connected with a rubber tubing for access to vacuum/argon. Vacuum was applied to the flask and LiCl was dried using heat-gun. After 10 min flask was brought to RT and filled with argon. Under positive pressure ~250 mL dry THF was transferred to the flask via cannula transfer. The flask temperature was lowered to −78° C. using dry ice/acetone bath. LiCl/THF solution was titrated with Sec-BuLi (1.4M) until a persistent lemon yellow/yellow was obtained. While the flask was at −78° C., MMA ampule was filled with argon, and pressure equilibrating stopcock was closed. After 5 min, dry ice/acetone bath was removed and flask was brought to RT. It takes 15-30 min for the decay of yellow color/sec-BuLi (complete decay of excess Sec-BuLi was observed). After a colorless solution was obtained, the flask temperature was lowered to −78° C. and required amount of sec-BuLi to generate active DPE initiator was added using airtight glass syringe. Then titrated 4-diethylphosphate-DPE solution was added by opening Rota flow stopcock, this results in color change from yellow to dark red, a color of active DPE-Li initiator. After 2-3 min, while the initiator solution was kept under rapid stirring MMA was added dropwise within 3-6 min. The reaction was continued further for 10 min and terminated with 3 mL degassed methanol. Flask was brought to RT and polymer was recovered by precipitation in water mixed with several drops of HCl. The polymer was dissolved in ethyl acetate followed by washing with water and then precipitated into hexane. The precipitated polymer was filtered and dried in vacuum at 60° C. and gave quantitative yield of 4-diethylphosphate capped PMMA-A with Mn=4.8 k, PDI=1.05.

Example 6: Synthesis of PMMA Capped with Dimethyl 4-(1,1-diphenylethylene) Phosphonate (PMMA-B) (Described in Scheme 6)

Synthesis was similarly followed by the procedure of example 5 using dimethyl 4-(1,1-diphenylethylene) phosphonate instead of diethyl 4-(1,1-diphenylethylene) phosphonate. Mn=4.7 k, PDI=1.06.

Example 7: Synthesis of PMMA Capped with Phenyl Ethyl 4-(1,1-diphenylethylene) Phosphinate (PMMA-C) (Described in Scheme 7)

Synthesis was similarly followed by the procedure of example 5 using phenyl ethyl 4-(1,1-diphenylethylene) phosphinate instead of dimethyl 4-(1,1-diphenylethylene) phosphonate. Mn=6.5 k, PDI=1.04.

Example 8: Synthesis of PMMA Capped with 4-(1,1-diphenylethylene) Phosphonic Acid (PMMA-D) (Described in Scheme 8)

PMMA capped with dimethyl 4-(1,1-diphenylethylene) phosphonate (PMMA-B) was treated with iodotrimethylsilane at RT for overnight and then precipitated into water. The filtered polymer was dried at vacuum oven. Mn=11.3 k, PDI=1.06.

Example 9: Synthesis of PS Capped with Diethyl 4-(1,1-diphenylethylene) phosphonate (PS-A) (Described in Scheme 9)

Step 1: 25 mL of Styrene (column passed and degassed) was taken into a calibrated ampule provided with two Rota flow stopcocks and 19F connecting glass joint. After careful degassing under dynamic vacuum while Styrene kept at low temperature, the 25 mL styrene monomer was collected, and ampule was closed under vacuum with stopcock. In the glovebox, diethyl 4-(1,1-diphenylethylene) phosphonate (DPE-I) was weighed (1.2 molar excess with respect to Sec-BuLi) in a vial and dissolved in ~5-10 mL toluene and transferred in a calibrated ampule provided with single Rota flow-stopcock and 19F joint. This solution was promptly titrated with dilute hexylDPE-Li solution until a pale orange color was persistent. After closing the stopcock, ampule was removed from glovebox. Both the styrene ampule and DPE ampule were attached to the flask using glass joints and yellow grease. Vacuum was applied to the flask and dried using heat-gun. After 10 min, the flask was brought to RT and filled with argon. Under positive pressure, ~250 mL dry THF was transferred to the flask via cannula transfer. The flask temperature was lowered to −78° C. using dry ice/acetone bath. THF solution was titrated with Sec-BuLi (1.4M) until a persistent lemon yellow/yellow color was obtained. While the flask was at −78° C., Styrene ampule was filled with argon, and pressure equilibrating stopcock was closed. After 5 min, dry ice/acetone bath was removed and flask was brought to RT. It takes 15-30 min for the decay of yellow color/sec-BuLi (complete decay of excess Sec-BuLi was observed). After a colorless solution was obtained, flask temperature was lowered to −78° C. and 7.9 mL of sec-BuLi (1.4M) initiator was added using airtight glass syringe. After 2-3 min, while the initiator solution was kept under rapid stirring, styrene was added dropwise within 3-6 min. Reaction was continued further for 30 minutes. Then, diethyl 4-(1,1-diphenylethylene) phosphonate was added from the ampule, the deep red color formed immediately indicated the living anion of DPE moiety. After 1 minute, the reaction mixture was terminated with 3 mL degassed methanol. The flask was brought to RT and the polymer was recovered by precipitation in 2 L of isopropanol. The precipitated polymer was filtered and dissolved in ethyl acetate and washed with water. The organic layer was precipitated to isopropanol and the polymer was dried in vacuum at 70° C. and gave quantitative yield of PS capped with diethyl 4-(1,1-diphenylethylene) phosphonate (PS-A), with Mn=9 k, PDI=1.08.

Example 10: Synthesis of PS Capped with Ethyl Ethyl 4-(1,1-diphenylethylene) phosphinate (PS-B) (Described in Scheme 10)

Synthesis was similarly followed by the procedure of example 9 using ethyl ethyl 4-(1,1-diphenylethylene) phosphinate instead of diethyl 4-(1,1-diphenylethylene) phosphonate. Mn=PDI=1.09.

Example 11: 9: Synthesis of PS Capped with Dimethyl 4-(1,1-diphenylethylene) phosphonate (PS-C) (Described in Scheme 11)

Synthesis was similarly followed by the procedure of example 9 using dimethyl 4-(1,1-diphenylethylene) phosphonate instead of diethyl 4-(1,1-diphenylethylene) phosphonate. Mn=10.6 k, PDI=1.07.

Brush Performance Test

The brush polymer was dissolved in PGMEA with 1 wt % solid content. 1% solution was coated at 1500 rpm on each tungsten and silicon oxide wafers and they were baked at 110° C./5 min under nitrogen and unreacted brush was rinsed away with PGMEA. After wafers were baked at 230° C. for 5 min under nitrogen, the water contact angle was measured by dropping water on each wafer.

TABLE 1

| Samples | | WCA (°) on W | WCA (°) on SiOx | C % by XPS on W | C % by XPS on SiOx | Contrast on W vs. SiOx |
|---|---|---|---|---|---|---|
| Ex 5 | PMMA-A | 64 | 56 | 9.1 | 0.26 | Good |
| Ex 6 | PMMA-B | 67 | 58 | 7.6 | 0.4 | Good |
| Ex 7 | PMMA-C | 62 | 44 | 3.8 | 0.15 | Good |
| Ex 9 | PS-A | 90 | 65 | NA | NA | Good |

PMMA-A, -B and -C brushes in the table shows good contrast when judging from WCA and XPS on between tungsten metal and silicon oxide by indicating high carbon content on W but much small carbon content on SiOx. PS-A clearly showed strong difference of water contact angle on both wafers indicating it is more hydrophobic on tungsten wafer but hydrophilic on silicon oxide.

Although the disclosed and claimed subject matter has been described and illustrated with a certain degree of particularity, it is understood that the disclosure has been made only by way of example, and that numerous changes in the conditions and order of steps can be resorted to by those skilled in the art without departing from the spirit and scope of the disclosed and claimed subject matter.

What is claimed is:

1. A polymer of structure (II), wherein
   $R_1$ is H, a C-1 to C-8 linear alkyl, a C-3 to C-8 branched alkyl, a C-3 to C-8 cyclic alkyl, an aryl, or an alkylenearyl;
   $R_2$ is H, a halide, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)($R_3$)($R_4$);
   $R_3$ and $R_4$ are independently an aryl, an alkylenearyl, a C-2 to C-8 alkyleneoxyalkyl, a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy;
   $L_1$ and $L_2$ are independently a direct valence bond, or a C-1 to C-8 alkylene spacer group;
   B is a direct valence bond, or a methylene spacer (—$CH_2$—)
   A is a styrenic polymer chain, or an acrylic polymer chain; and said polymer has a polydispersity ranging from 1 to 1.1;

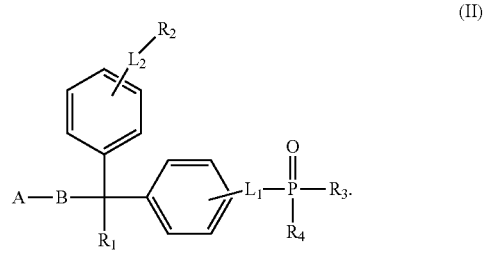

(II)

2. The polymer of claim 1, wherein $R_1$ is H;

$R_2$ is H, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)(R$_3$)(R$_4$);

$R_3$ and $R_4$ are independently an aryl, an alkylenearyl, a C-2 to C-8 alkyleneoxyalkyl, a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy;

$L_1$ and $L_2$ are independently a direct valence bond, or a C-1 to C-8 alkylene spacer group; and A is a styrenic polymer chain.

3. The polymer of claim 1, having structure (IIa), wherein $R_2$ is H, or —P(=O)(R$_3$)(R$_4$);

$R_3$ and $R_4$ are independently an aryl, an alkylenearyl, a C-2 to C-8 alkyleneoxyalkyl, a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and $L_1$ and $L_2$ are independently a direct valence bond, or a C-1 to C-8 alkylene spacer group;

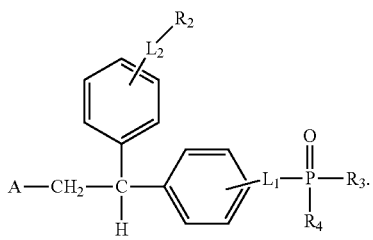

(IIa)

4. The polymer of claim 3 which has structure (IIb);

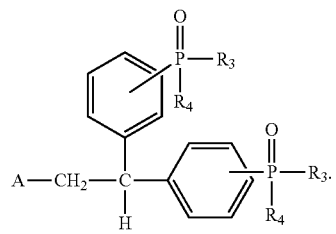

(IIb)

5. The polymer of claim 1, wherein it has structure (IIc), wherein $R_3$ and $R_4$ are independently an aryl, an alkylenearyl, a C-2 to C-8 alkyleneoxyalkyl, a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and $L_1$ is a direct valence bond, or a C-1 to C-8 alkylene spacer group;

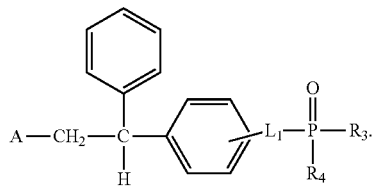

(IIc)

6. The polymer of claim 5, has structure (IId);

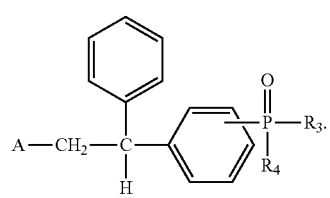

(IId)

7. The polymer of claim 1, wherein $R_1$ is a C-1 to C-8 linear alkyl, a C-3 to C-8 branched alkyl or a C-3 to C-8 cyclic alkyl, an aryl, an alkylenearyl;

$R_2$ is H, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)(R$_3$)(R$_4$);

$R_3$ and $R_4$ are independently an aryl, an alkylenearyl, a C-2 to C-8 alkyleneoxyalkyl, a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy;

$L_1$ and $L_2$ are independently a direct valence bond, or a C-1 to C-8 alkylene spacer group; and A is an acrylic polymer chain.

8. The polymer of claim 7, wherein it has structure (IIf), wherein $R_{alk}$ is a C-1 to C-7 linearly alkyl, a C-3 to C-7 branched alkyl, or a C-3 to C-7 cyclic alkyl;

$R_2$ is H, or —P(=O)(R$_3$)(R$_4$);

$R_3$ and $R_4$ are independently an aryl, an alkylenearyl, a C-2 to C-8 alkyleneoxyalkyl, a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and $L_1$ and $L_2$ are independently a direct valence bond, or a C-1 to C-8 alkylene spacer group;

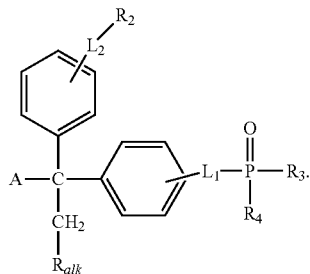

(IIf)

9. The polymer of claim 8, which has structure (IIg);

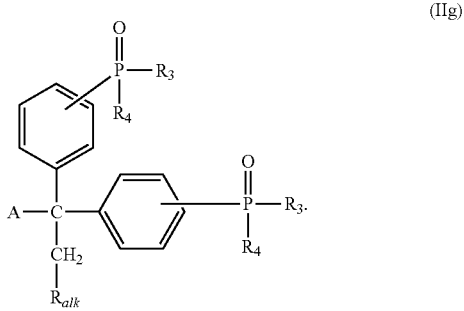
(IIg)

10. The polymer of claim 7, wherein it has structure (IIh), wherein
- $R_3$ and $R_4$ are independently an aryl, an alkylenearyl, a C-2 to C-8 alkyleneoxyalkyl, a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and
- $L_1$ is a direct valence bond, or a C-1 to C-8 alkylene spacer group;

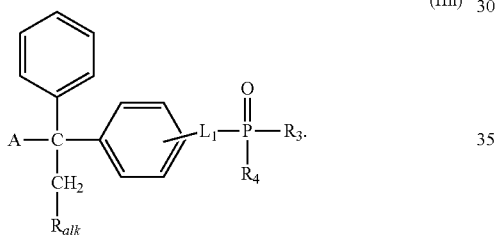
(IIh)

11. The polymer of claim 10, wherein $L_1$ and $L_2$ are both a direct valence bond and the polymer of structure (II) has structure (IIi);

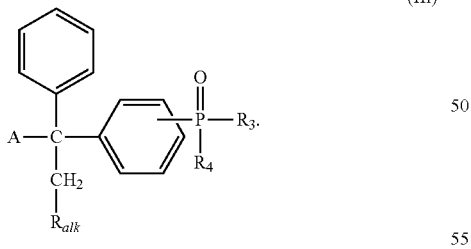
(IIi)

12. The polymer of claim 2, wherein said polymer is a styrenic polymer having structure (III), wherein
- $R_{e1}$ is H, a C-1 to C-8 linear alkyl, a C-3 to C-8 branched alkyl, a C-3 to C-8 cyclic alkyl, an aryl, or an alkylenearyl;
- $R_2$ is H, a halide, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)($R_3$)($R_4$);
- $R_3$ and $R_4$ are independently an aryl, an alkylenearyl, a C-2 to C-8 alkyleneoxyalkyl, a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy;
- $L_1$ and $L_2$ are independently a direct valence bond, or a C-1 to C-8 alkylene spacer group;
- $R_5$ is H, a C-1 to C-4 linear alkyl; $R_6$ is H, a halide, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; n is the number of repeat units; and
- said styrenic polymer has a polydispersity ranging from 1 to 1.1;

(III)

13. The polymer of claim 12, wherein it has structure (IIIa), wherein
- $R_2$ is H, or —P(=O)($R_3$)($R_4$);
- $R_3$ and $R_4$ are independently an aryl, an alkylenearyl, a C-2 to C-8 alkyleneoxyalkyl, a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and
- $L_1$ and $L_2$ are independently a direct valence bond, or a C-1 to C-8 alkylene spacer group;

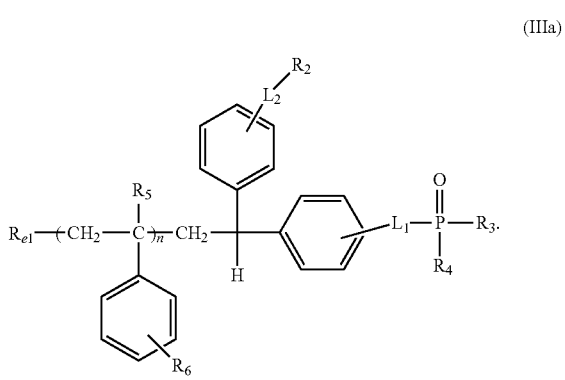
(IIIa)

14. The polymer of claim 13, which has structure (IIb);

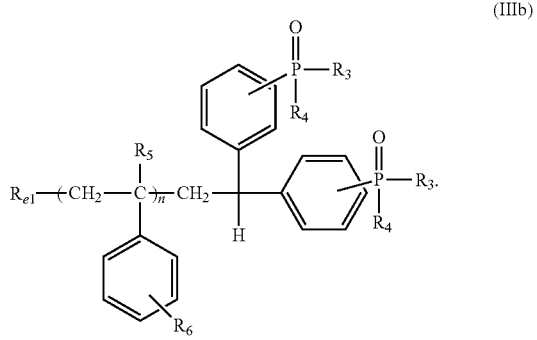
(IIIb)

15. The polymer of claim 12, wherein it has structure (IIIc), wherein
- $R_3$ and $R_4$ are independently an aryl, an alkylenearyl, a C-2 to C-8 alkyleneoxyalkyl, a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and
- $L_1$ is a direct valence bond, or a C-1 to C-8 alkylene spacer group;

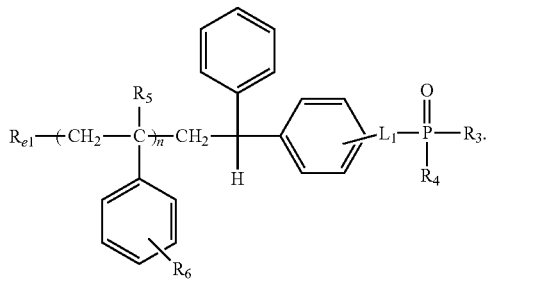
(IIIc)

16. The polymer of claim 15, wherein $L_1$ is a direct valence bond and has structure (IIId);

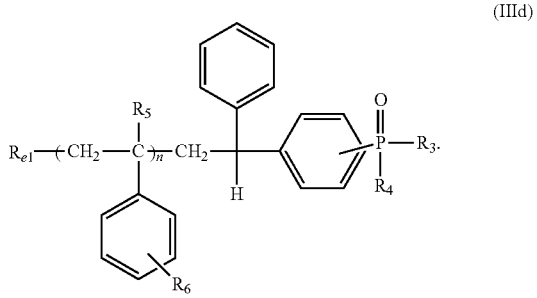
(IIId)

17. The polymer of claim 7, wherein said polymer is an acrylic polymer having structure (IV), wherein
- $R_{alk}$ is a C-1 to C-7 linearly alkyl, a C-3 to C-7 branched alkyl, or a C-3 to C-7 cyclic alkyl;
- $R_2$ is H, a halide, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy, a C-3 to C-8 cyclic alkyloxy, or —P(=O)($R_3$)($R_4$);
- $R_3$ and $R_4$ are independently an aryl, an alkylenearyl, a C-2 to C-8 alkyleneoxyalkyl, a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy;
- $L_1$ and $L_2$ are independently a direct valence bond, or a C-1 to C-8 alkylene spacer group;
- $R_7$ is H or a C-1 to C-4 linear alkyl;
- $R_8$ is a C-1 to C-8 linear alkyl, a C-3 to C-8 branched alkyl or a C-3 to C-8 cyclic alkyl;
- $R_{e2}$ is an end group selected from H, a C-1 to C-8 linear alkyl, a C-3 to C-8 branched alkyl, or a C-3 to C-8 cyclic alkyl;
- n1 is the number of repeat units in said acrylate polymer of structure (IV); and said acrylic polymer has a polydispersity ranging from 1 to 1.1;

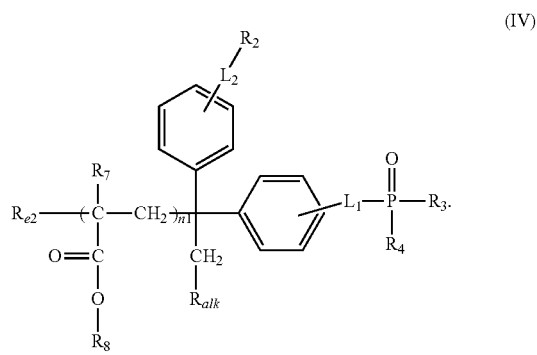
(IV)

18. The polymer of claim 17, wherein it has structure (IVa), wherein
- $R_{alk}$ is a C-1 to C-7 linearly alkyl, a C-3 to C-7 branched alkyl, or a C-3 to C-7 cyclic alkyl;
- $R_2$ is H, or —P(=O)($R_3$)($R_4$);
- $R_3$ and $R_4$ are independently an aryl, an alkylenearyl, a C-2 to C-8 alkyleneoxyalkyl, a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and
- $L_1$ and $L_2$ are independently a direct valence bond, or a C-1 to C-8 alkylene spacer group;

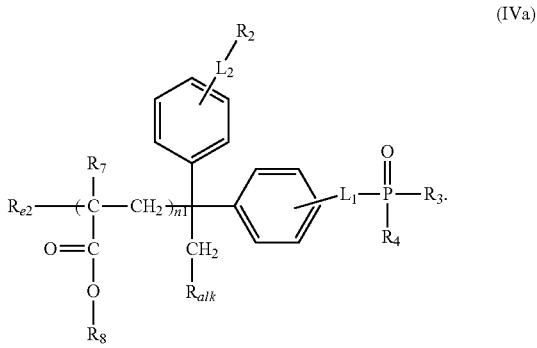
(IVa)

19. The polymer of claim 18, which has structure (IVb);

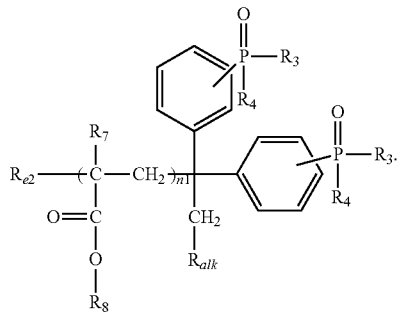
(IVb)

20. The polymer of claim 17, wherein it has structure (IVc), wherein $R_3$ and $R_4$ are independently an aryl, an alkylenearyl, a C-2 to C-8 alkyleneoxyalkyl, a C-2 to C-8 haloalkyl, a C-1 to C-8 linear alkyl, a C-3 to C-8 branched alkyl, a C-3 to C-8 cyclic alkyl, a C-1 to C-8 linear alkyloxy, a C-3 to C-8 branched alkyloxy or a C-3 to C-8 cyclic alkyloxy; and $L_1$ is a direct valence bond, or a C-1 to C-8 alkylene spacer group;

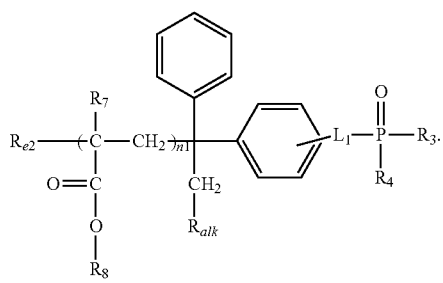
(IVc)

21. The polymer of claim 17, wherein $L_1$ is a direct valence bond and the polymer has structure (IVd);

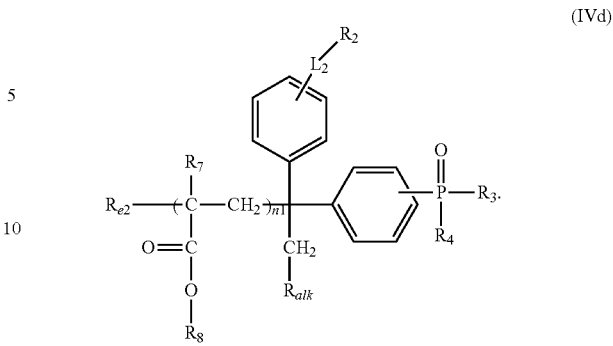
(IVd)

22. A composition comprising a polymer of claim 1 and a spin casting solvent.

23. A process of forming a pinning layer brush selectively on a substrate which comprises both metallic surface areas and a non-metallic surface area, comprising the steps;
  i) coating said composition according to claim 22, on a said substrate, forming a film,
  ii) baking said film at a temperature from about 120° C. to about 250° C. for about 1 minute to about 1 hour, to form a baked film,
  iii) washing said baked film with a solvent to remove ungrafted polymer, forming a pinning layer brush only on said metallic surface areas of said substrate.

24. A process comprising the steps;
  ia) coating said composition according to claim 22, on a substrate which comprises both metallic surface areas and non-metallic surface areas, forming a film,
  iia) baking said film at a temperature from about 120° C. to about 250° C. for about 1 minute to about 1 hour, to form a baked film,
  iiia) washing said baked film with a solvent to remove ungrafted polymer, forming a grafted substrate wherein pinning layer brushes are only present on said metallic surface areas of said substrate,
  iva) coating said grafted substrate with a neutral layer composition, forming a neutral layer coating,
  va) curing said neutral layer coating,
  via) washing away, with a solvent, uncured neutral layer, leaving in said non-metallic areas of said substrate a neutral directing brush forming on said substrate a chemoepitaxy directing layer,
  viia) coating said chemoepitaxy directing layer with a block copolymer solution, forming a coating of block copolymer,
  viiia) annealing said coating of block copolymer, to form a directed self-assembled film of the block copolymer on said chemoepitaxy directing layer.

* * * * *